(12) United States Patent
Kim et al.

(10) Patent No.: US 10,833,114 B2
(45) Date of Patent: Nov. 10, 2020

(54) IMAGE SENSORS

(71) Applicant: Samsung Electronics Co., Ltd., Suwon-si (KR)

(72) Inventors: Bum Suk Kim, Hwaseong-si (KR); Jong Hoon Park, Seoul (KR); Chang Rok Moon, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/587,944

(22) Filed: Sep. 30, 2019

(65) Prior Publication Data

US 2020/0027912 A1   Jan. 23, 2020

Related U.S. Application Data

(63) Continuation of application No. 16/014,088, filed on Jun. 21, 2018, now Pat. No. 10,497,730.

(30) Foreign Application Priority Data

Jan. 10, 2018 (KR) .................. 10-2018-0003164

(51) Int. Cl.
*H01L 31/0232* (2014.01)
*H01L 27/146* (2006.01)

(52) U.S. Cl.
CPC .... *H01L 27/14621* (2013.01); *H01L 27/1463* (2013.01); *H01L 27/14605* (2013.01); *H01L 27/14612* (2013.01); *H01L 27/14623* (2013.01); *H01L 27/14627* (2013.01); *H01L 27/14643* (2013.01)

(58) Field of Classification Search
USPC ........ 257/432, 13, 22, 84, 94, 103, 184, 431
See application file for complete search history.

(56) References Cited

U.S. PATENT DOCUMENTS

| | | | |
|---|---|---|---|
| 7,280,146 B2 | 10/2007 | Takahashi et al. | |
| 7,297,919 B2 | 11/2007 | Mishina et al. | |

(Continued)

FOREIGN PATENT DOCUMENTS

| | | |
|---|---|---|
| EP | 2091082 A2 | 8/2009 |
| JP | 2006-304364 A | 11/2006 |
| KR | 2008-0015310 A | 2/2008 |

OTHER PUBLICATIONS

Extended European Search Report dated May 20, 2019 for corresponding European Application No. 1915087905.

(Continued)

*Primary Examiner* — Niki H Nguyen
(74) *Attorney, Agent, or Firm* — Harness, Dickey & Pierce, P.L.C.

(57) ABSTRACT

An image sensor may include a substrate which includes a plurality of block regions. Each block region may include a separate plurality of pixel regions. Each pixel region may include a separate photoelectric element of a plurality of photoelectric elements in the substrate and a separate micro lens of a plurality of micro lenses on the substrate. Each micro lens of the plurality of micro lenses may be laterally offset from a vertical centerline of the pixel region towards a center of the block region. Each block region of the plurality of block regions may include a common shifted shape of the plurality of micro lenses of the block region.

19 Claims, 15 Drawing Sheets

(56) References Cited

U.S. PATENT DOCUMENTS

| | | | |
|---|---|---|---|
| 8,106,994 B2 | 1/2012 | Ichimura | |
| 8,274,123 B2 | 9/2012 | Tanaka | |
| 9,160,911 B2 | 10/2015 | Lin et al. | |
| 2005/0253943 A1 | 11/2005 | Takahashi et al. | |
| 2006/0027732 A1 | 2/2006 | Ahn | |
| 2007/0045518 A1 | 3/2007 | Mishina et al. | |
| 2009/0207267 A1 | 8/2009 | Inoue et al. | |
| 2010/0059844 A1* | 3/2010 | Tanaka | H01L 27/14627 257/432 |
| 2012/0086095 A1 | 4/2012 | Nishiyama et al. | |
| 2013/0194482 A1 | 8/2013 | Nicol et al. | |
| 2016/0191768 A1 | 6/2016 | Shin et al. | |
| 2016/0266695 A1* | 9/2016 | Bae | G06K 9/00053 |
| 2017/0163920 A1 | 6/2017 | Hwang et al. | |
| 2017/0221960 A1 | 8/2017 | Lin et al. | |
| 2017/0302839 A1 | 10/2017 | Borel et al. | |

OTHER PUBLICATIONS

Singapore Search Report and Written Opinion dated Aug. 1, 2019 for corresponding Application No. 10201808136V.

* cited by examiner

| P1 | P2 | P3 | P4 |
|----|----|----|----|
| P101 | P102 | P103 | P104 |
| P201 | P202 | P203 | P204 |

FIG. 16

|     | B1(B) | B2(Gb) | | B3(B) | | |
|-----|-------|--------|--|-------|--|--|
| R1  | P1(B) | P2(Gb) | P3(B) | P4(Gb) | P5(B) | P6(Gb) | P7(B) |
| R2  | P101(Gr) | P102(R) | P103(Gr) | P104(R) | P105(Gr) | P106(R) | P107(Gr) |
| R3  | P201(B) | P202(Gb) | P203(B) | P204(Gb) | P205(B) | P206(Gb) | P207(B) |
| R4  | P301(Gr) | P302(R) | P303(Gr) | P304(R) | P305(Gr) | P306(R) | P307(Gr) |
| R5  | P401(B) | P402(Gb) | P403(B) | P404(Gb) | P405(B) | P406(Gb) | P407(B) |
| R6  | P501(Gr) | P502(R) | P503(Gr) | P504(R) | P505(Gr) | P506(R) | P507(Gr) |
| R7  | P601(B) | P602(Gb) | P603(B) | P604(Gb) | P605(B) | P606(Gb) | P607(B) |

1000

B4(Gr), B5(R), B6(Gr), B7(B), B8(Gb), B9(B)

C1 C2 C3 C4 C5 C6 C7

IMAGE SENSORS

CROSS-REFERENCE TO RELATED APPLICATION

This application is a continuation of U.S. application Ser. No. 16/014,088, filed on Jun. 21, 2018, which claims priority, under 35 U.S.C. § 119, from Korean Patent Application No. 10-2018-0003164 filed on Jan. 10, 2018 in the Korean Intellectual Property Office, and all the benefits accruing therefrom under 35 U.S.C. 119, the contents of which in its entirety are herein incorporated by reference.

BACKGROUND

1. Field of the Invention

The present inventive concepts relate to an image sensor.

2. Description of the Related Art

An image sensor of a semiconductor device is an element that converts an optical image into an electrical signal. Image sensors may be classified into a CCD (charge coupled device) type and a CMOS (complementary metal oxide semiconductor) type. The CMOS type image sensor is abbreviated as a CIS (CMOS image sensor). The CIS includes a plurality of two-dimensionally arranged pixels. Each of the pixels includes a photodiode. The photodiode serves to convert the incident beam into an electrical signal.

Recently, in accordance with the development of the computer industry and the communication industry, demand for image sensors with improved performance has been increased in various fields such as a digital camera, a video camera, a PCS (personal communication system), a game machine, a security camera, a medical micro camera and robot. In addition, as the semiconductor devices are highly integrated, image sensors are also highly integrated.

SUMMARY

Some aspects of the present inventive concepts provide image sensors which are configured to provide an image with improved resolution and visibility based on dividing the shift of the micro lenses of said image sensors as one or more block units.

The aspects of the present inventive concepts are not limited to those mentioned above and another aspect which is not mentioned can be clearly understood by those skilled in the art from the description below.

According some example embodiments, an image sensor may include a substrate which includes a plurality of block regions. Each block region of the plurality of block regions may include a separate plurality of pixel regions. Each pixel region of each block region may include a separate photoelectric element of a plurality of photoelectric elements in the substrate and a separate micro lens of a plurality of micro lenses on the substrate, wherein each micro lens of the plurality of micro lenses is laterally offset from a vertical centerline of the pixel region towards a center of the block region. Each block region of the plurality of block regions may include a common shifted shape of the plurality of micro lenses of the block region.

According to some example embodiments, an image sensor may include a substrate, the substrate including a first block region and a second block region, the first block region including a first pixel region and a second pixel region, and the second block region including a third pixel region and a fourth pixel region. The first through fourth pixel regions may include first to fourth photoelectric elements in separate, respective pixel regions of the first to fourth pixel regions and first to fourth micro lenses on separate, respective pixel regions of the first to fourth pixel regions. A distance between a vertical centerline of the first pixel region and a center of the first block region may be a first distance, a distance between a vertical centerline of the second pixel region and the center of the first block region may be a second distance, a distance between a vertical centerline of the third pixel region and a center of the second block region may be the first distance, and a distance between a vertical centerline of the fourth pixel region and the center of the second block region may be the second distance. The first micro lens may be laterally offset from the vertical centerline of the first pixel region by a first interval towards the center of the first block region, the second micro lens may be laterally offset from the vertical centerline of the second pixel region by a second interval towards the center of the first block region by a second internal, the third micro lens may be laterally offset from the vertical centerline of the third pixel region by the first interval towards the center of the second block region, and the fourth micro lens may be laterally offset from the vertical centerline of the fourth pixel region by the second interval towards the center of the second block region.

According to some example embodiments, an image sensor may include a substrate, the substrate including a first block region, a second block region, and a third block region, the first through third block regions including separate, respective pluralities of pixel regions. The image sensor may include a first boundary separation film in the substrate, the first boundary separation film defining the first and second block regions such that the first boundary separation film is divided between the first and second block regions. The image sensor may include a second boundary separation film in the substrate, the second boundary separation film defining the second and third block regions such that the second boundary separation film is divided between the second and third block regions. The image sensor may include a plurality of micro lenses on the substrate and on separate, respective pixel regions of the pluralities of pixel regions of the first through third block regions. Intervals between micro lenses of the pluralities of micro lenses may be not constant. The plurality of micro lenses located in the first block region and the plurality of micro lenses located in the second block region may collectively include a symmetrical pattern of micro lenses with each other on a basis of the first boundary separation film. The plurality of micro lenses located in the second block region and the plurality of micro lenses located in the third block region may collectively include a symmetrical pattern of micro lenses with each other on a basis of the second boundary separation film.

BRIEF DESCRIPTION OF THE DRAWINGS

The above and other aspects and features of the present inventive concepts will become more apparent by describing in detail example embodiments thereof with reference to the attached drawings, in which:

FIG. 5 is a conceptual diagram for explaining a block region of an image sensor according to some example embodiments of the present inventive concepts;

FIG. 16 is a conceptual diagram for explaining a binning mode of an image sensor according to some example embodiments of the present inventive concepts.

DETAILED DESCRIPTION OF THE EMBODIMENTS

Hereinafter, an image sensor according to some example embodiments of the present inventive concepts will be described with reference to FIGS. 1 to 10.

Figure 1:
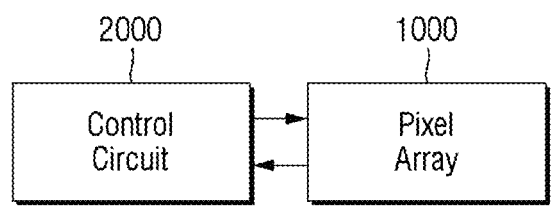
FIG. 1 is a block diagram illustrating an image sensor according to some example embodiments of the present inventive concepts.

FIG. 1 is a block diagram illustrating the image sensor according to some example embodiments of the present inventive concepts.

Referring to FIG. 1, a first image sensor 1220 may include a control circuit 2000 and a pixel array 1000.

The pixel array 1000 includes a plurality of two-dimensionally arranged unit pixels. The plurality of unit pixels serves to convert an optical image into an electrical output signal.

The control circuit 2000 is connected to the pixel array 1000 to apply input signals to the pixel array 1000, and may receive the transmission of output signals from the pixel array 1000. For example, the control circuit 2000 may receive electrical signals generated by a plurality of photoelectric elements 110 included in the pixel array 1000, as described further below. The control circuit 2000 may control the overall operation of the pixel array 1000.

Figure 2:
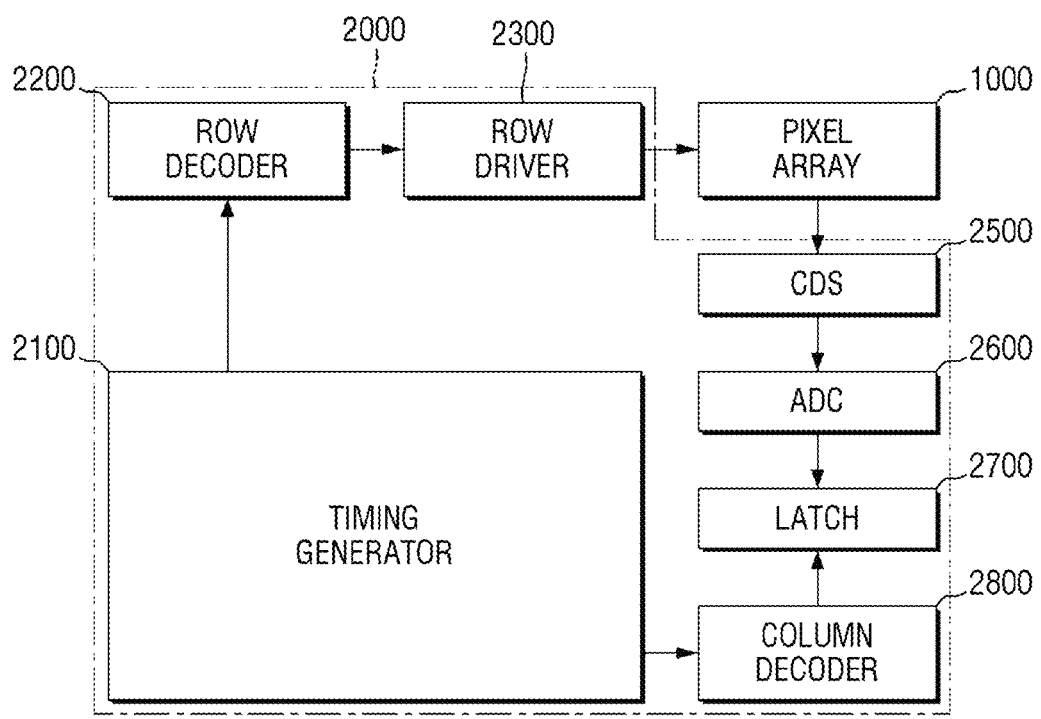
FIG. 2 is a block diagram of the image sensor for explaining the control circuit of FIG. 1 in detail.

FIG. 2 is a block diagram of the image sensor for explaining the control circuit of FIG. 1 in detail.

Referring to FIG. 2, the control circuit 2000 includes a timing generator 2100, a row decoder 2200, a row driver 2300, a correlated double sampler (CDS) 2500, an analog-to-digital converter (ADC) 2600, a latch 2700, a column decoder 2800, and the like.

The pixel array 1000 is driven by receiving a plurality of driving signals, such as a row selection signal, a reset signal, and a charge transmission signal, from the row driver 2300. In some example embodiments, the converted electrical output signal is provided to the correlated double sampler 2500 via a vertical signal line.

The timing generator 2100 provides a timing signal and a control signal to the row decoder 2200 and the column decoder 2800.

The row driver 2300 provides a plurality of driving signals for driving the plurality of unit pixels to the pixel array 1000 in accordance with the results decoded by the row decoder 2200. Generally, when the unit pixels are arranged in the form of a matrix, the driving signals are provided for each row.

The correlated double sampler 2500 receives the output signals formed on the pixel array 1000 through the vertical signal lines to hold and samples the output signals. That is, a specific noise level and a signal level due to the output signal are doubly sampled to output a difference level corresponding to a difference between the noise level and the signal level.

The analog-to-digital converter 2600 converts the analog signal corresponding to the difference level into a digital signal and outputs the converted signal.

The latch 2700 latches the digital signal, and the latched signal is sequentially output to the video signal processing unit in accordance with the decoding result in the column decoder 2800.

Figure 3:
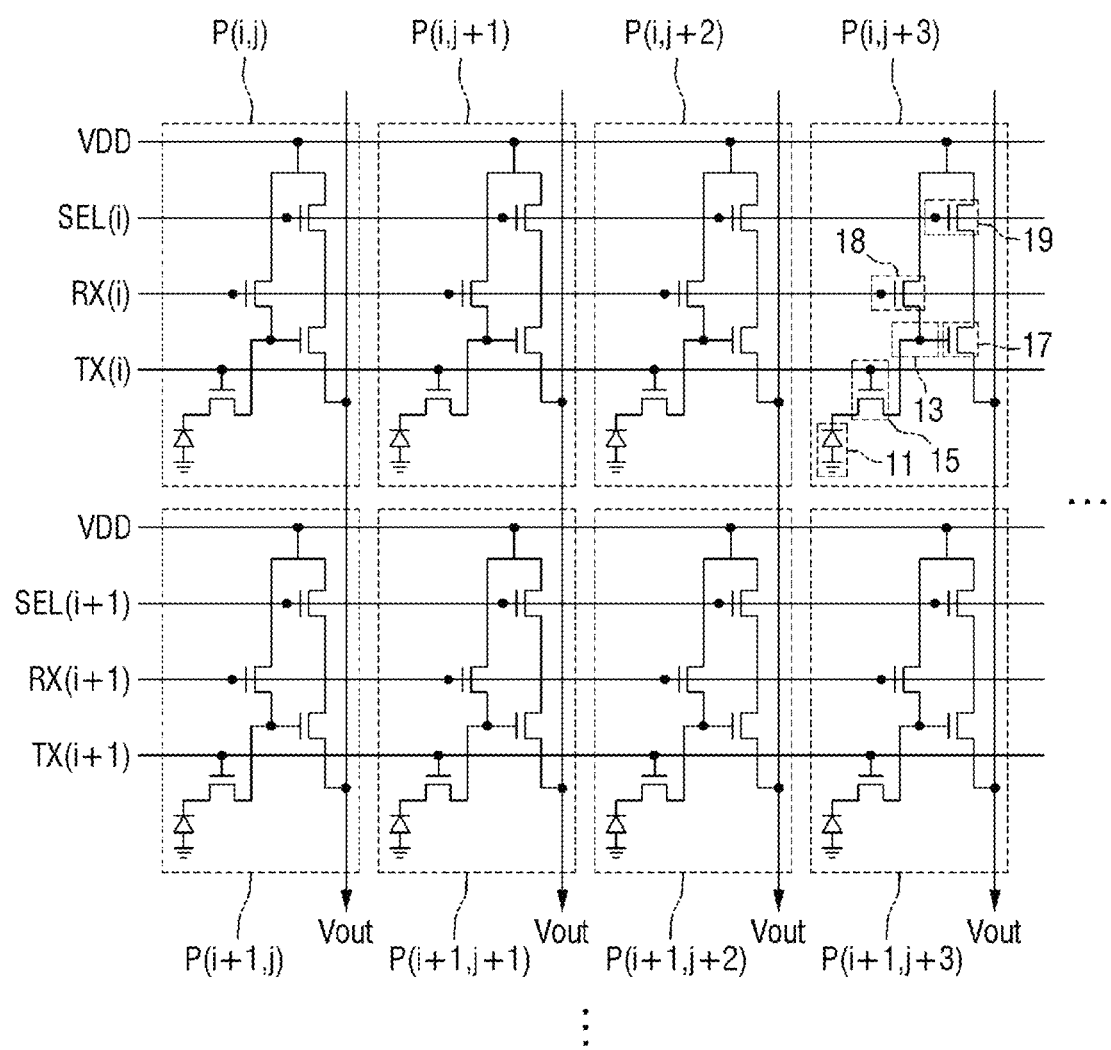
FIG. 3 is an equivalent circuit diagram of a pixel array of FIG. 2.

FIG. 3 is an equivalent circuit diagram of the pixel array of FIG. 2.

Referring to FIG. 3, the pixels P are arranged in a matrix form to form a pixel array 1000. Each pixel P includes a phototransistor 11, a floating diffusion region 13, a charge transfer transistor 15, a drive transistor 17, a reset transistor 18, and a selection transistor 19. The functions thereof will be described using an i row pixels (P(i, j), P(i, j+1), P(i, j+2), P(i, j+3), . . . ) as an example.

The photoelectric transistor 11 absorbs incident beam and accumulates charges corresponding to the beam quantity. A photodiode, a phototransistor, a photogate, a pinned photodiode or a combination thereof can be applied to the photoelectric transistor 11, and a photodiode is illustrated in the drawing.

Each photoelectric transistor 11 is coupled with each charge transfer transistor 15 which transmits the accumulated charge to the floating diffusion region 13. Since the floating diffusion region 13 is a region which converts charge to voltage and has a parasitic capacitance, charges are stored accumulatively.

The drive transistor 17 exemplified as a source follower amplifier amplifies the change in the electric potential of the floating diffusion region 13 which receives the transmission of the charge accumulated in each photoelectric transistor 11, and supplies it to an output line (Vout).

The reset transistor 18 periodically resets the floating diffusion region 13. The reset transistor 18 may include a single MOS transistor which is driven by a bias provided by a reset line 18$i$ which applies a particular (or, alternatively, predetermined) bias (i.e., a reset signal). When the reset transistor 18 is turned on by the bias provided by the reset line 18$i$, the particular (or, alternatively, predetermined) electric potential provided to the drain of the reset transistor 18, for example, the power supply voltage (VDD) is transferred to the floating diffusion region 13.

The selection transistor 19 serves to select the pixels P to be read in row units. The selection transistor 19 may include a single MOS transistor which is driven by the bias (i.e., the row selection signal) provided by the row select line (SELi). When the selection transistor 19 is turned on by the bias provided by the row selection line (SELi), the particular (or, alternatively, predetermined) electric potential provided to the drain of the selection transistor 19, for example, the power supply voltage (VDD) is transferred to the drain region of the drive transistor 17.

A transfer line 15i which applies the bias to the charge transfer transistor 15, a reset line 18i which applies the bias to the reset transistor 18, and a row selection line (SEL(i)) which applies the bias to the selection transistor 19 may be arranged to extend substantially parallel to each other in the row direction.

Figure 4:
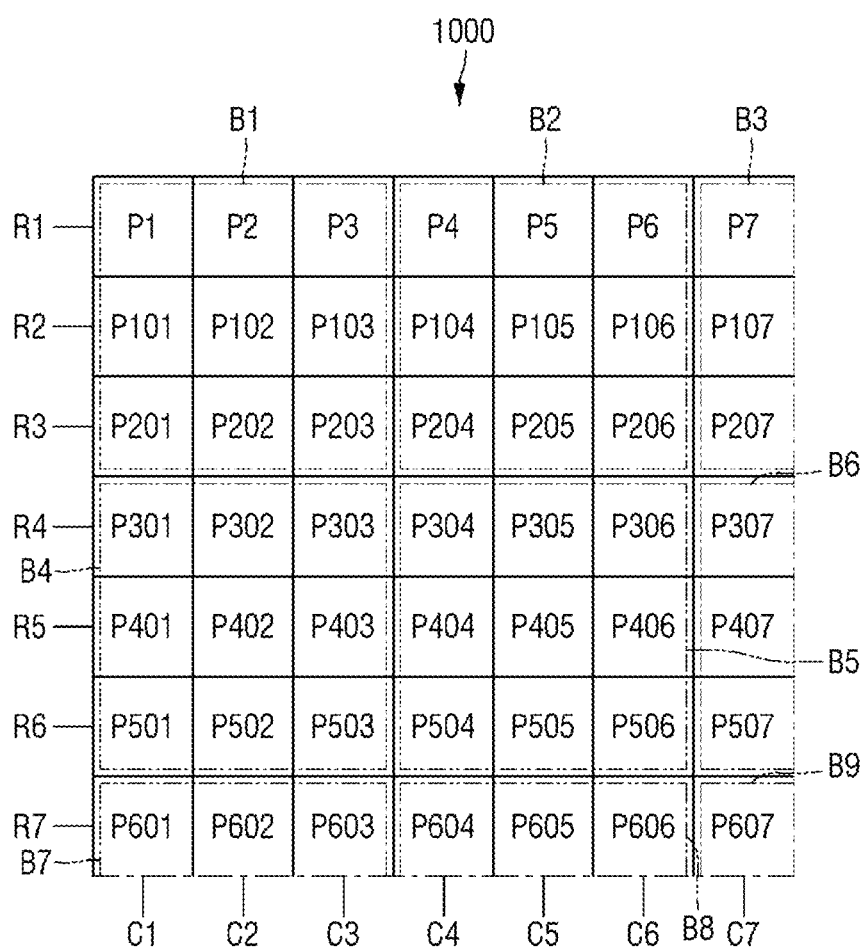
FIG. 4 is a plan conceptual diagram for explaining the arrangement of a block region and a pixel region of the pixel array of FIG. 2.

FIG. 4 is a schematic plan view for explaining the arrangement of the block region and the pixel region of the pixel array of FIG. 2.

Referring to FIG. 4, the pixel array 1000 may include a plurality of pixel regions (P1 to P7, P101 to P107, P201 to P207, P301 to P307, P401 to P407, P501 to P507, and P601 to P607).

The plurality of pixel regions (P1 to P7, P101 to P107, P201 to P207, P301 to P307, P401 to P407, P501 to P507, and P601 to P607) may be defined as a plurality of rows and a plurality of columns. In FIG. 4, only 49 pixel regions of 7 rows and 7 columns are illustrated, but this illustrates only a partial pixel region for the sake of convenience, and the inventive concepts are not limited thereto. That is, the number of pixel regions may be variously applied.

The row signal lines (R1 to R7) may be connected to each row of the plurality of pixel regions (P1 to P7, P101 to P107, P201 to P207, P301 to P307, P401 to P407, P501 to P507, and P601 to P607). Each of the row signal lines (R1 to R7) may be SEL(i) of FIG. 3. That is, a signal can be applied to the pixel regions of the entire row via one row signal line (R1 to R7).

The column signal lines (C1 to C7) may be connected to each column of the plurality of pixel regions (P1 to P7, P101 to P107, P201 to P207, P301 to P307, P401 to P407, P501 to P507, P601 to P607). Each column signal line (C1 to C7) may be Vout of FIG. 3. That is, the signal of the pixel region of the entire columns can be output via one column signal line (C1 to C7).

Each of the plurality of pixel regions (P1 to P7, P101 to P107, P201 to P207, P301 to P307, P401 to P407, P501 to P507, and P601 to P607) can be classified into a plurality of block regions (B1 to B9). That is, a plurality of pixel regions can be included in one block region. For example, the first block region B1 may include a plurality of pixel regions (P1 to P3, P101 to P103, and P201 to P203).

The plurality of block regions (B1 to B9) may include block regions having the same ("a common") size and shape. For example, the first block region B1 and the second block region B2 may have the same square shape and the same size. Each block region may include the same number of pixel regions.

In FIG. 4, since one block region can be include nine pixel regions and is a square, the pixel region may have three rows and three columns. However, the present inventive concepts is not limited to these examples. The number of pixel regions belonging to one block region may be variously changed.

FIG. 5 is a conceptual diagram for explaining a block region of another image sensor according to some example embodiments of the present inventive concepts.

Referring to FIG. 5, the first block region B1 may include a total of 12 pixel regions (P1 to P4, P101 to P104, and P201 to P204). At least one block region (e.g., B1) may have a square shape. The first block region B1 may be a rectangle rather than a square. Restated, at least one block region (e.g., B1) may have a rectangle shape. In this way, the shape of the block region of the first image sensor 1220 according to some example embodiments of the present inventive concepts may vary depending on the particular purpose and need.

Figure 6:
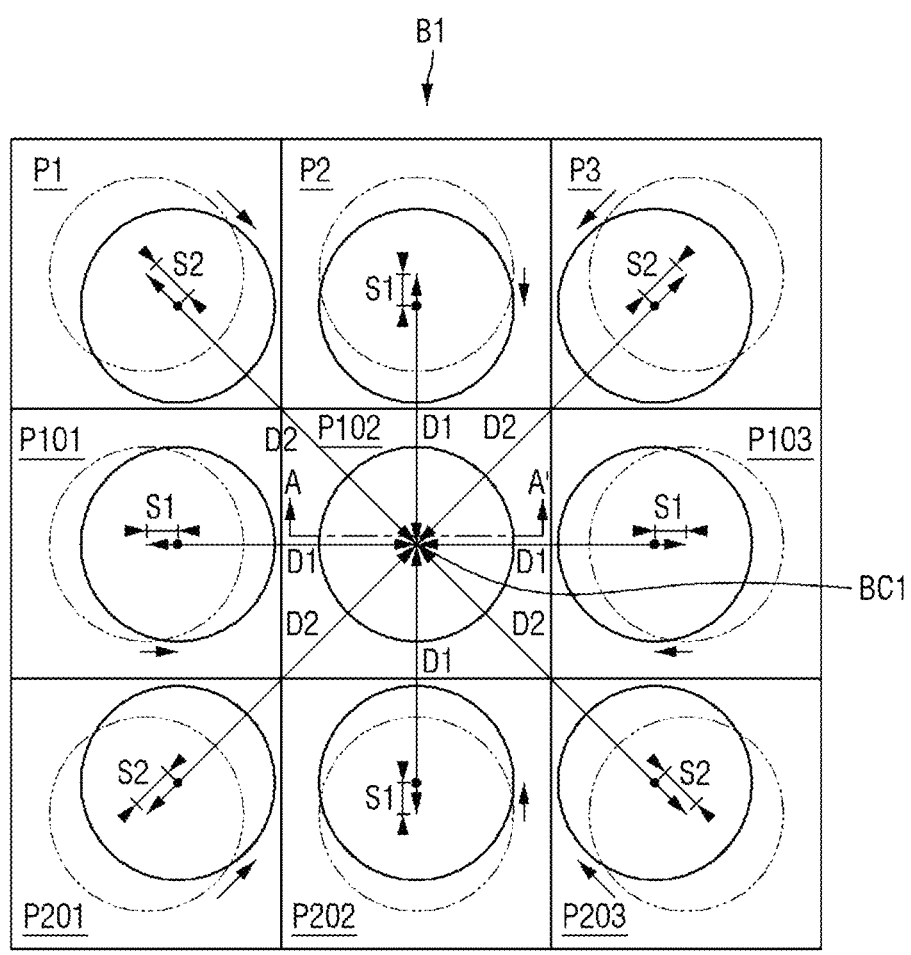
FIG. 6 is a plan view for explaining shift of micro lenses of an image sensor according to some example embodiments of the present inventive concepts.

FIG. 6 is a plan view illustrating shift of micro lenses of the image sensor according to some example embodiments of the present inventive concepts. Since other blocks also have the same structure as the first block region B1, only the first block region B1 will be explained in FIG. 6 for the sake of convenience.

Referring to FIG. 6, each of the pixel regions (P1 to P3, P101 to P103, and P201 to P203) may include a micro lens 220. The micro lenses 220 may be disposed one by one on the respective pixel regions (P1 to P3, P101 to P103, and P201 to P203).

The micro lenses of the respective pixel regions (P1 to P3, P101 to P103, and P201 to P203) are not disposed at the center of each pixel region (P1 to P3, P101 to P103, and P201 to P203) and may be shifted. Specifically, the micro lens 220 may be disposed to be biased in the direction of the center BC1 of the first block region B1.

At this time, the shifted degree of the micro lens 220, that is, the biased degree may vary depending on the distance between the center of each pixel region (P1 to P3, P101 to P103, and P201 to P203) and the center BC1 of the first block region B1.

Specifically, since the P102 pixel region has the same center as the center BC1 of the first block region B1, it may not be shifted from the center of the P102 pixel.

Since the P2, P101, P103, and P202 pixel regions are adjacent to the P102 pixel region to share the side surface, the distance between the center BC1 of the first block region B1 and the center of each pixel region may be the same as a first distance D1.

The micro lenses 220 of the P2, P101, P103, and P202 pixel regions may be shifted in the direction of the P102 pixel region, that is, in the direction of the center BC1 of the first block region B1 from a vertical centerline of a pixel region (e.g., vertical centerline PC2 of pixel region P2) by a first interval S1.

Unlike this, since the P1, P3, P201 and P203 pixel regions are adjacent to the pixel region of P102 in a diagonal direction, the distance between the center BC1 of the first block region B1 and the center of each pixel region may be the same as a second distance D2. At this time, the second distance D2 may naturally be larger than the first distance D1.

The micro lenses 220 of the P1, P3, P201 and P203 pixel regions may be shifted by the second interval S2 in the direction of the P102 pixel region, that is, in the direction of the center BC1 of the first block region B1. At this time, the second interval S2 may be larger than the first interval S1.

That is, the interval at which the micro lens 220 of each pixel region of the first block region B1 is shifted may be determined in accordance with the distance between the center of the first block region B1 and the center of each pixel region. Specifically, as the distance between the center of the first block region B1 and the center of each pixel region is large, the interval at which the micro lenses 220 of each pixel region are shifted may increase.

Figure 7:
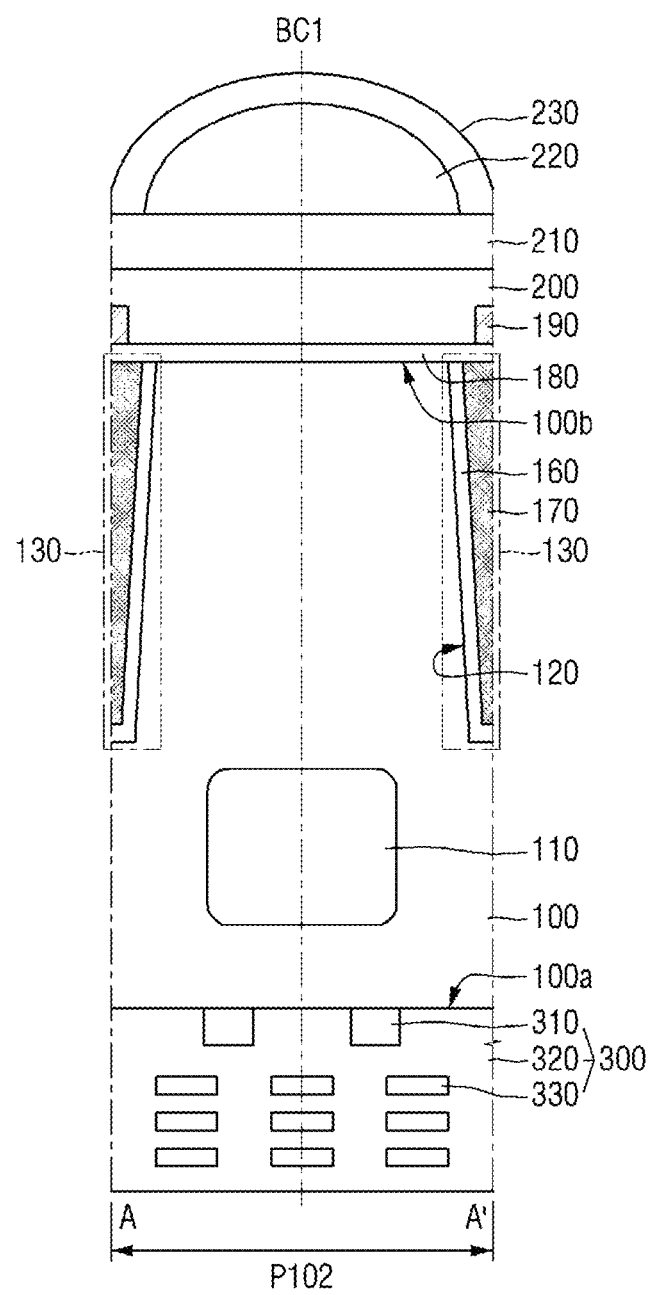
FIG. 7 is a cross-sectional view taken along a line VII-VII' of FIG. 6.

FIG. 7 is a cross-sectional view taken along a line VII-VII' of FIG. 6.

The first image sensor 1220 according to some example embodiments of the present inventive concepts includes a substrate 100, a photoelectric element 110, a boundary separation film 130, a fixed charge layer 160, a reflection prevention film 170, a lower planarization film 180, a color filter 200, a side surface reflection prevention film 190, an upper planarization film 210, a micro lens 220, a protective film 230, and an insulation structure 300. In the case of another pixel region, since other parts except the position of the micro lens 220 are the same as those of the P102 pixel region, only the P102 pixel region will be described for convenience.

The substrate 100 includes a first side 100*a* and a second side 100*b* opposite to each other. The first side 100*a* of the substrate 100 may be a front side of the substrate 100, and the second side 100*b* of the substrate may be a back side of the substrate. However, the present inventive concepts is not limited thereto.

As shown in FIG. 7, a pixel region (e.g., P102 pixel region) includes a vertical centerline (e.g., PC102) that extends orthogonally to the sides 100*a* and 100*b* of the substrate 100. In some example embodiments, for example where the pixel region (e.g., P102 pixel region) is located in the center of a block region (e.g., block region B1), the vertical centerline of the pixel region (e.g., PC103) and the center of the block region (e.g., BC1) may be identical.

As shown in at least FIG. 7, the color filter 200, which may also be referred to herein as the "color filter layer," may be between the substrate 100 and the micro lens 220. The color filter 200 may have any one of at least a red color, a blue color, or a green color. Restated, the color filter 200 may be configured to selectively filter any particular one of red light, blue light, or green light.

For example, the substrate 100 may use a P type or N type bulk substrate, or may be used by growing the P type or N type epitaxial layer on a P type bulk substrate, or by growing the P type or N type epitaxial layer on a N type bulk substrate. In addition to a semiconductor substrate, a substrate such as an organic or plastic substrate can also be used as the substrate 100.

The P102 pixel region may be formed in the substrate 100. The P102 pixel region may be a region in which incident beam incident through the micro lens 220 from outside is detected, respectively. The P102 pixel region may be defined to be separated from other pixel regions by the boundary separation film 130 which will be described later.

For example, the photoelectric element 110, for example, a photodiode is formed in each of the substrate 100 of the P102 pixel region. The photoelectric element 110 may be formed close to the first side 100*a* of the substrate 100, but is not limited thereto.

The photoelectric element 110 may be the photoelectric transistor 11 of FIG. 3 described above, that is, a photodiode, a phototransistor, a photogate, a pinned photodiode or a combination thereof. The photoelectric element 110 may be configured to generate an electrical signal, and the electrical signal may be communicated from pixel array 1000 (in which block region B1 may be located) to control circuit 2000.

The boundary separation film 130 may be formed in the substrate 100. The boundary separation film 130 may define the P102 pixel region within the substrate 100. The boundary separation film 130 may be formed at the edges of each of the P102 pixel regions. By the boundary separation film 130, the P102 pixel region may be defined as a closed space. The planar cross-sectional shape of the boundary separation film 130 may be a closed curve in the form of a loop.

The boundary separation film 130 may be formed in the boundary separation trench 120. The boundary separation trench 120 may be formed by being etched in the depth direction in the substrate 100. The boundary separation trench 120 may be formed on the second side 100*b* of the substrate 100 and extend in the direction of the first side 100*a*. The boundary separation trench 120 may not reach the second side 100*b* of the substrate 100.

At this time, the depth of the boundary separation trench 120 may be smaller than the depth at which the photoelectric element 110 is located. This is for the purpose of preventing the photoelectric element from being damaged by the formation of the boundary separation trench 120. However, the inventive concepts are not limited thereto.

In the image sensor according to some example embodiments of the present inventive concepts, when the boundary separation trench 120 is formed so that the horizontal distance from the photoelectric element 110 is sufficiently for away, the depth of the boundary separation trench 120 may be deeper than the depth at which the photoelectric element 110 is located.

The side surface of the boundary separation trench 120 may have a tapered shape as shown in FIG. 7. Specifically, the width of the boundary separation trench 120 may become narrower toward a downward direction, and may become wider toward an upward direction. However, the inventive concepts are not limited thereto.

As shown in the drawing, the boundary separation film 130 may be filled with a fixed charge layer 160 to be described later, and a reflection prevention film 170 formed on the fixed charge layer 160.

In some example embodiments, the boundary separation film 130 may be filled with one substance. In such a case, the fixed charge layer 160 and the reflection prevention film 170 may be formed on the boundary separation film 130. At this time, the boundary separation film 130 may include at least one of silicon oxide, silicon nitride, silicon oxynitride and a low dielectric constant substance having a lower dielectric constant than silicon oxide. The low dielectric constant substance may include, for example, but is not limited to, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric substance, or a combination thereof.

The upper surface of the boundary separation film 130 and the upper surface of the substrate 100 may be the same plane. However, the present inventive concepts is not limited to these examples.

The fixed charge layer 160 may be formed on the second side 100*b* of the substrate 100 and the surface (side surface and bottom surface) of the boundary separation trench 120. The fixed charge layer 160 may be formed on the whole surface or a partial surface of the second side 100*b* of the substrate 100.

The fixed charge layer 160 may be formed into a P+ type in the case where the photoelectric element 110 formed in the pixel region, for example, the photodiode (11 of FIG. 3) is an N type. That is, the fixed charge layer 160 serves to reduce the dark current by reducing EHP (Electron-Hole Pair) thermally generated o the second side 100b of the substrate 100. In some cases, the fixed charge layer 160 may be omitted.

For example, the fixed charge layer 160 includes, for example, a metal oxide film or a metal nitride film, and as the metal, hafnium (Hf), aluminum (Al), zirconium (Zr), tantalum (Ta), and titanium (Ti) may be used. Further, the fixed charge layer 160 may include at least one of La, Pr, Ce, Nd, Pm, Sm, Eu, Gd, Tb, Dy, Ho, Tm, Yb, Lu and Y. Furthermore, the fixed charge layer 160 may be formed of a hafnium oxynitride film or an aluminum oxynitride film.

Although the fixed charge layer 160 is illustrated as a single layer in the drawings, the fixed charge layer 160 may be a laminated structure in which two or more layers formed of the same or different substances are combined.

The reflection prevention film 170 may be formed on the fixed charge layer 160. The reflection prevention film 170 may completely fill the boundary separation trench 120. The reflection prevention film 170 may serve to prevent reflection of beam which is incident from the outside. The reflection prevention film 170 may include substances having different refractive index from the fixed charge layer 160. For example, the reflection prevention film 170 may be formed of an insulating film, such as a silicon oxide film, a silicon nitride film, a silicon oxynitride film, a resin, a combination thereof, or a laminate thereof.

The configuration of the double layer of the fixed charge layer 160 and the reflection prevention film 170 may have a reflection prevention function by the different refraction coefficients mentioned above. Therefore, reflection of beam incident on the second side 100b of the substrate 100 may be prevented.

The substance and the thickness of the reflection prevention film 170 may change, depending on the wavelength of the beam used in the photo process. For example, a silicon oxide film having a thickness of about 50 to 200 Å and a silicon nitride film having a thickness of about 300 to 500 Å may be stacked and used as the reflection prevention film 170. However, the inventive concepts are not limited thereto.

The lower planarization film 180 may be formed on the reflection prevention film 170, the fixed charge layer 160, and the substrate 100. The lower planarization film 180 may include, for example, at least one of a silicon oxide film-based substance, a silicon nitride film-based substance, a resin, or a combination thereof.

The lower planarization film 180 may be used as a buffer film for preventing the substrate 100 from being damaged in a patterning process for forming a pad (not shown) in the non-pixel region.

The lower planarization film 180 may include at least one of a silicon oxide film-based substance, a silicon nitride film-based substance, a resin, or a combination thereof. As the lower planarization film 180, for example, a silicon oxide film having a thickness of about 3000 to 8000 Å may be used. However, the inventive concepts are not limited thereto.

The color filter 200 may be formed on the lower planarization film 180. The color filter 200 may filter the remaining wavelength bands except the partial wavelength regions of the incident beam. For example, in the case of a blue color filter, the color filter 200 may filter the remaining wavelength bands except the blue beam, and in the case of a red color filter, the color filter 200 may filter the remaining wavelength bands except the red beam. Further, in the case of a green color filter, the color filter 200 may filter the remaining wavelength bands except the green beam.

As a result, the beam having passed through the color filter 200 may be beam having a specific color. The beam having passed through the color filter 200 may reach the photoelectric element 110 through the lower structures. The photoelectric element 110 may generate an electric current by the incident beam of a specific color.

The side surface reflection prevention film 190 may be formed on the lower planarization film 180. The side surface reflection prevention film 190 may cover a part of the lower planarization film 180. The side surface reflection prevention film 190 may overlap the boundary separation film 130 in a vertical direction. That is, the side surface reflection prevention film 190 may be disposed at the edge of the P102 pixel region.

The side surface reflection prevention film 190 may be disposed on the side surface of the color filter 200. Specifically, the color filter 200 may cover the side surface and the upper surface of the side surface reflection prevention film 190. That is, the height of the upper surface of the side surface reflection prevention film 190 may be lower than the height of the upper surface of the color filter 200.

The side surface reflection prevention film 190 may prevent incident beam passing through the color filter 200 from being reflected or scattered to the side surface. That is, the side surface reflection prevention film 190 may prevent photons reflected or scattered at the interface between the color filter 200 and the lower planarization film 180 from moving to other sensing regions. Since the side surface reflection prevention film 190 acts at the interface as described above, it may cover only a part of the side surface of the color filter 200.

The side surface reflection prevention film 190 may include a metal. The side surface reflection prevention film 190 may include, for example, at least one of tungsten (W), aluminum (Al), and copper (Cu).

The upper planarization film 210 may be formed flat on the color filter 200. The upper planarization film 210 may include at least one of, for example, a silicon oxide film-based substance, a silicon nitride film-based substance, a resin, or a combination thereof. Although the upper planarization film 210 is illustrated as a single film, this is only for the convenience of description, and the inventive concepts are not limited thereto.

Although FIG. 7 illustrates a configuration in which the upper planarization film 210 and the lower planarization film 180 are formed on the upper side and the lower side of the color filter 200, respectively, as an example, the inventive concepts are not limited thereto. For example, a planarization film may be formed only on the lower side of the color filter 200, or a planarization film may be formed only on the upper side of the color filter 200. In some example embodiments, no planarization film may present on both the upper side and the lower side of the color filter 200.

The micro lens 220 may be formed on the upper planarization film 210. The micro lens 220 may have an upward convex shape as shown. The convex shape of the micro lens 220 serves to cause incident beam to concentrate in the P102 pixel region.

The micro lens 220 may be made of an organic substance such as PR (Photo Resist). However, the inventive concepts are not limited thereto, and the micro lens 220 may be formed using an inorganic substance. Formation of the micro lens 220 with the organic substance may be formation of the micro lens 220, for example, by forming an organic substance pattern on the upper planarization film 210 and by performing a thermal process. The organic substance pattern mat change to the form of micro lenses 220 by the thermal process.

The protective film 230 may be formed with a constant thickness along the surface of the micro lens 220. The protective film 230 may be a mineral oxide film. For example, a silicon oxide film ($SiO_2$), a titanium oxide film ($TiO_2$), a zirconium oxide film ($ZrO_2$), a hafnium oxide film ($HfO_2$), a laminated film thereof and a combination thereof may be used. In particular, LTO (Low Temperature Oxide) which is a type of silicon oxide film may be used for the protective film 230. The reason for using LTO in this way is that, since LTO is manufactured at a low temperature (about 100° C. to 200° C.), damage to the lower film can be reduced. Furthermore, since LTO is amorphous, the surface is smooth and the reflection/refraction/scattering or the like of incident beam can be suppressed to the minimum.

Since the micro lens 220 is made of an organic substance, it may be vulnerable to external shock. Therefore, the protective film 230 serves to protect the micro lens 220 from external impact. Furthermore, there may be some space between adjacent micro lenses, but the protective film 230 serves to fill such a space.

If the space between the adjacent micro lenses 220 is filled, the condensing ability of incident beam can be improved. The reason is that it is possible to reduce the reflection/refraction/scattering of incident beam reaching the space between the adjacent micro lenses 220.

The insulating structure 300 may be formed on the first side 100a of the substrate 100. That is, the insulation structure 300 may be formed on the front side of the substrate 100. The insulating structure 300 may include an insulating layer 320, a gate structure 310, and a wiring structure 330.

The insulating layer 320 may include at least one of, for example, a silicon oxide film, a silicon nitride film, a silicon oxynitride film, a low dielectric constant substance, and combinations thereof. The insulating layer 320 may cover and surround the gate structure 310 and the wiring structure 330 to be described later. That is, the insulating layer 320 may be responsible for insulation between the gate structure 310 and the wiring structure 330.

The gate structure 310 may be disposed on the first side 100a of the substrate 100. The gate structure 310 may be, for example, the gate of the charge transfer transistor 15, the gate of the reset transistor 18, the gate of the selection transistor 19, the gate of the drive transistor or the like.

Referring to FIGS. 6 and 7 again, the photoelectric element 110 and the micro lens 220 of the P102 pixel region may be arranged at the center BC1 of the first block region B1. Since the P102 pixel region is a pixel region located at the center of the first block region B1, the micro lens 220 and the photoelectric element 110 are arranged. However, since other pixel regions are not located at the center of the first block region B1, the micro lens 220 may be shifted in the direction of the center BC1 of the first block region B1.

Figure 8:
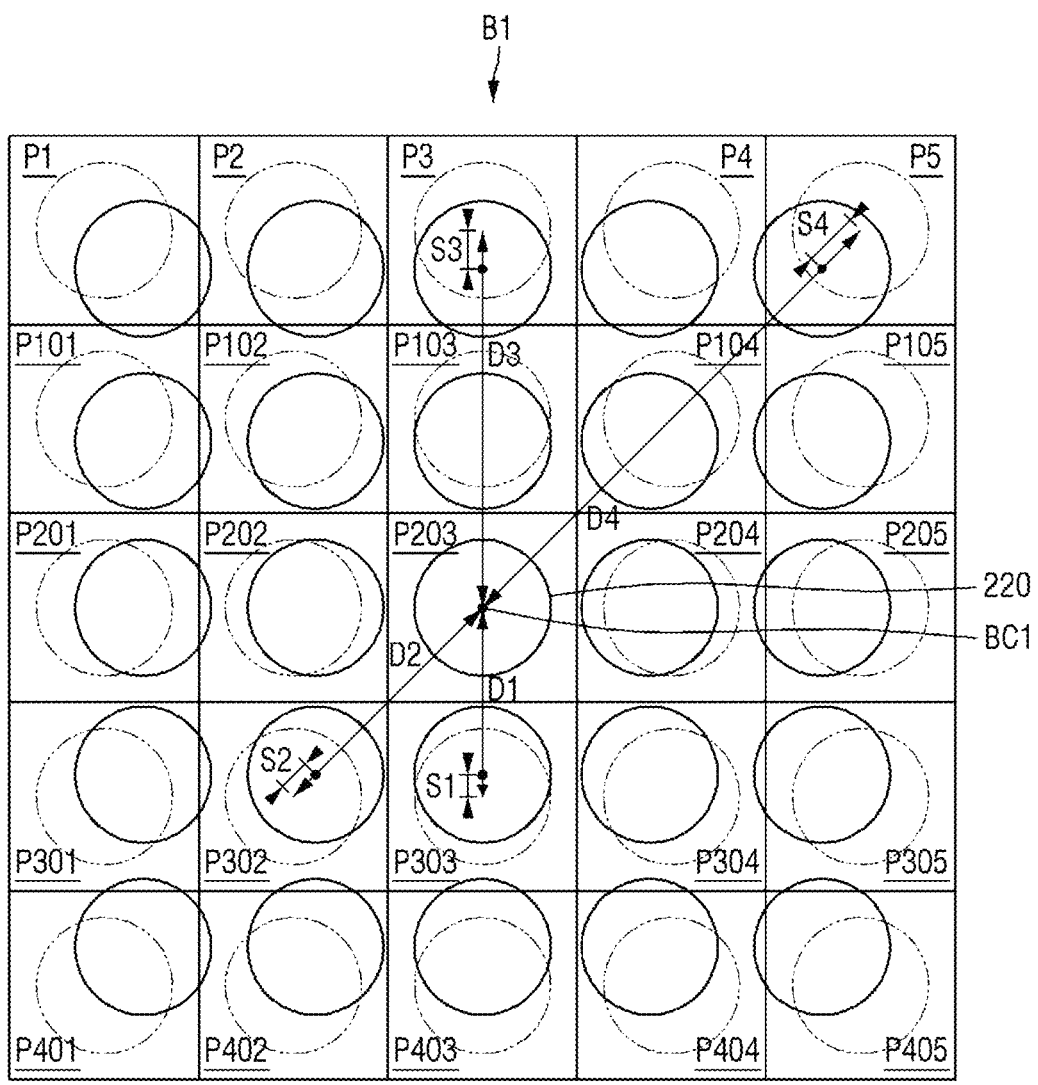
FIG. 8 is a plan view for explaining shift of micro lenses of the image sensor according to some example embodiments of the present inventive concepts.

FIG. 8 is a plan view illustrating the shift of micro lens of the image sensor according to some example embodiments of the present inventive concepts.

Referring to FIG. 8, the first block region B1 of the first image sensor 1220 according to some example embodiments of the present inventive concepts may include a total of 25 pixel regions (P1 to P5, P101 to P105, P201 to P205, P301 to P305, and P401 to P405).

Each of the pixel regions (P1 to P5, P101 to P105, P201 to P205, P301 to P305, and P401 to P405) may include a micro lens 220. The micro lenses 220 may be arranged one by one in each of the pixel regions (P1 to P5, P101 to P105, P201 to P205, P301 to P305, and P401 to P405). Restated, each pixel region of the block region B1 may include a separate micro lens 220 of a plurality of micro lenses 220 on the substrate 100.

The micro lenses of the respective pixel regions (P1 to P5, P101 to P105, P201 to P205, P301 to P305, and P401 to P405) may be shifted without being located at the center of the respective pixel regions (P1 to P5, P101 to P105, P201 to P205, P301 to P305, and P 401 to P405). Specifically, the micro lens 220 may be disposed to be biased in the direction of the center BC1 of the first block region B1. Restated, each micro lens 220 of the plurality of micro lenses 220 in the block region B1 may be laterally offset (e.g., by interval S3 in pixel region P3) from a vertical centerline (e.g., PC3) of the pixel region in which the micro lens 220 is included (e.g., P3) towards a center BC1 of the block region B1.

At this time, the shifted degree of the micro lens 220, that is, the biased degree may vary depending on the distance between the center of each pixel region (P1 to P5, P101 to P105, P201 to P205, P301 to P305, and P401 to P405) and the center BC1 of the first block region B1.

Specifically, since the P203 pixel region has the same center as the center BC1 of the first block region B1 (e.g., PC203=BC1), the micro lens 220 of the P203 pixel region may not be shifted from the center of the P203 pixel.

Since the P103, P202, P204, and P303 pixel regions are adjacent to the P203 pixel region to share the side surface, the distance between the center BC1 of the first block region B1 and the center of each pixel region (e.g., vertical centerline PC303 of the P303 pixel region) may be the same as the first distance D1.

The micro lenses 220 of the P103, P202, P204, and P303 pixel regions may be shifted in the direction of the P203 pixel region, that is, in the direction of the center BC1 of the first block region B1 by a first interval S1.

In contrast, since the P102, P104, P302, and P304 pixel regions are adjacent to the pixel region of P203 in the diagonal direction, the distance between the center BC1 of the first block region B1 and the center of each pixel region (e.g., vertical centerline PC302 of the P302 pixel region) may be the same as the second distance D2. At this time, the second distance D2 may naturally be larger than the first distance D1.

The micro lenses 220 of the P102, P104, P302, and P304 pixel regions may be shifted ("laterally offset" from respective pixel region centerlines) in the direction of the P203 pixel region, that is, in the direction of ("towards") the center BC1 of the first block region B1 by the second interval S2. At this time, the second interval S2 may be larger than the first interval S1.

Since the P3, P201, P205, and P403 pixel regions overlap the P203 pixel region in the direction of row or column and are spaced apart ("isolated from direct contact with") the P203 pixel region by one pixel region therebetween, the distance between the center BC1 of the first block region B1 and the center of each pixel region (e.g., vertical centerline PC3 of the P3 pixel region) may be the same as the third distance D3. At this time, the third distance D3 may be larger than the first distance D1 and the second distance D2.

The micro lenses 220 of the P3, P201, P205, and P403 pixel regions may be shifted in the direction of the P203 pixel region, that is, in the direction of the center BC1 of the first block region B1 by a third interval S3. At this time, the third interval S3 may be larger than the first interval S1 and the second interval S2.

Since the P1, P5, P401 and P405 pixel regions are spaced apart from ("isolated from direct contact with") the pixel region of P203 in the diagonal direction by an interval of one pixel region therebetween, the distance between the center BC1 of the first block region B1 and the center of each pixel region (e.g., vertical centerline PC5 of the P5 pixel region) may be the same as a fourth distance D4. At this time, the fourth distance D4 may be larger than the first distance D1, the second distance D2, and the third distance D3.

The micro lenses 220 of the P1, P5, P401 and P405 pixel regions may be shifted by the fourth interval S4 in the direction of the P203 pixel region, that is, in the direction of the center BC1 of the first block region B1. At this time, the fourth interval S4 may be larger than the first interval S1, the second interval S2, and the third interval S3.

In addition, since the distance between the P101, P105, P301, and P305 pixel regions and the first block region B1 is larger than the third distance D3 and smaller than the fourth distance D4, the shifted interval of the micro lens 220 may be larger than the third interval S3 and smaller than the fourth interval S4.

That is, as the distance between the center of the first block region B1 and the center of each pixel region is larger, the shifted interval of the micro lens 220 may become large.

Figure 9:
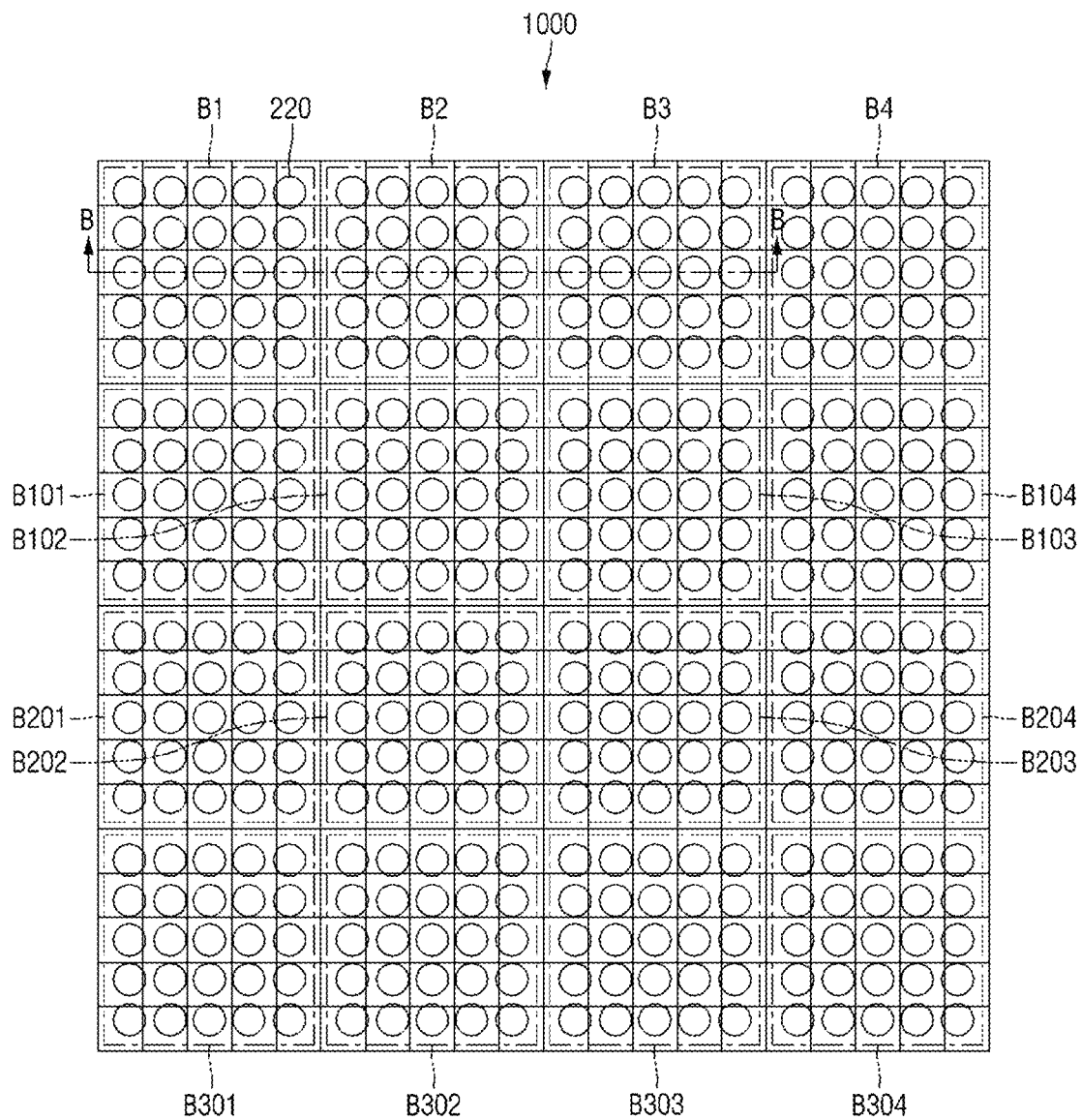
FIG. 9 is a plan view for explaining an image sensor including the block region of FIG. 8.

FIG. 9 is a plan view for explaining the image sensor including the block region of FIG. 8 and further including a plurality of block regions B1, B2, B3, B4, B101, B102, B103, B104, B201, B202, B203, B204, B301, B302, B303, and B304. Each block region shown in FIG. 9, which may also be referred to herein as a block region of substrate 100, may have a similar structure as the block region B1 shown in at least FIG. 8. Accordingly, a first image sensor 1220 that includes the pixel array 1000 shown in at least FIG. 9 may including a plurality of block regions B1 to B304, where each block region includes a plurality of pixel regions, for example the pixel regions P1 to P405 as shown in FIG. 8 with regard to block region B1. As shown in at least FIG. 7, each pixel region of the plurality of pixel regions of each block region may include a separate photoelectric element 110 of a plurality of photoelectric elements 110 in the substrate 100. Restated, the plurality of photoelectric elements 110 may be in separate, respective pixel regions. As further shown in at least FIG. 7, each pixel region of the plurality of pixel regions of each block region may include a separate micro lens 220 of a plurality of micro lenses 220 on the substrate 100. Restated, the plurality of micro lenses 220 may be on separate, respective pixel regions. As shown above with reference to FIG. 8, each micro lens 220 of the plurality of micro lenses may be laterally offset from a vertical centerline PC1 of the pixel region (e.g. P1) in which the micro lens 220 is included towards a center BC1 of the block region (e.g., B1). As shown in FIGS. 8-9, each block region of the plurality of block regions may include a common shifted shape of the plurality of micro lenses of the block region. For example, as shown in FIG. 8, the micro lenses 220 of block region B1 are each laterally offset from the vertical centerline of respective pixel regions (save for the micro lens 220 of pixel region P203) such that the block region B1 has a particular pattern ("configuration") of micro lenses 220. Such a pattern of micro lenses 220 may be referred to herein as a "shifted shape" of the micro lenses 220 of the block region B1. As further shown in FIG. 9, each of the block regions B1 to B304 may have a common "shifted shape" based on each including the same ("a common") pattern of micro lenses 220 therein.

As shown in FIG. 9, at least two block regions (e.g., B1 and B2) of the first image sensor 1220 may include common quantities of pixel regions. As further shown, at least two block regions (e.g., B1 and B2) of the first image sensor 1220 may each include pixel regions aligned as a common quantity of rows and a common quantity of columns.

As shown in FIGS. 8-9, the intervals (e.g., D1, D2, D3, D4, etc.) between micro lenses 220 of the pluralities of micro lenses in the block regions may not be constant.

Referring to FIGS. 8 and 9, in the pixel array 1000 of the first image sensor 1220 according to some example embodiments of the present inventive concepts, the micro lens 220 may be shifted in units of block regions. In this case, the shifted shape of the micro lens 220 of each block region may be the same.

For example, the micro lenses 220 of the first block region B1 may be shifted to the center of the first block region B1, and the micro lenses 220 of the second block region B2 may be shifted to the center of the second block region B2. The shift shapes of these micro lenses 220 (e.g., a shape of each separate pattern of micro lenses 220 in each separate block region) may be completely identical to each other (e.g., may be a common shape). At this time, the expression "completely identical" is a concept including a fine step according to the manufacturing process.

Figure 10:
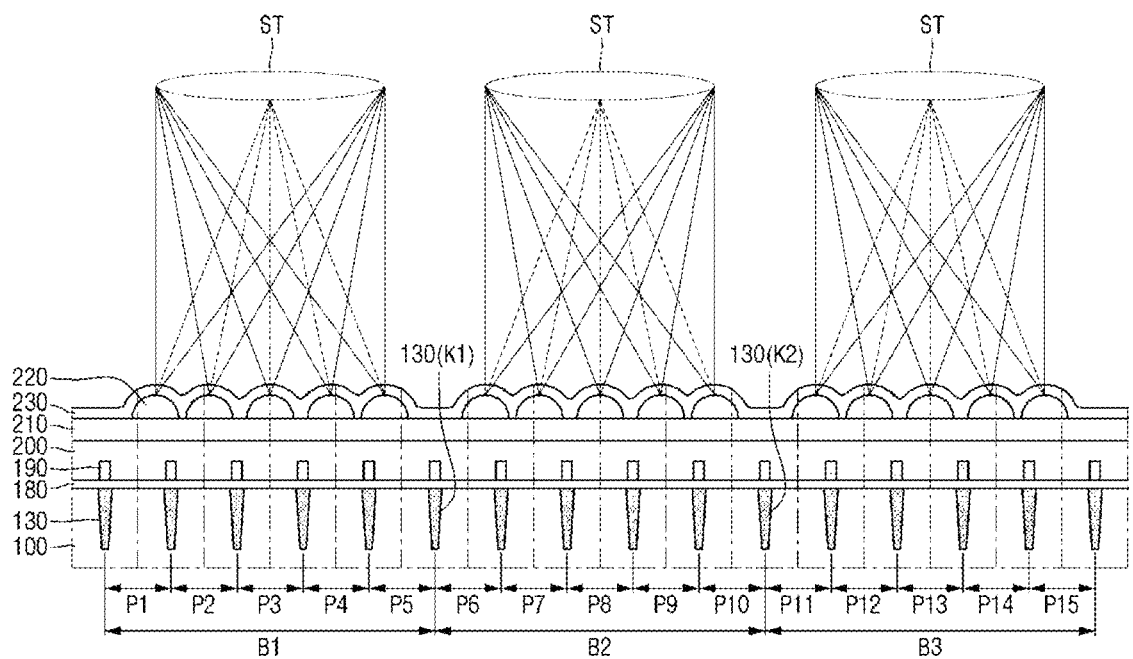
FIG. 10 is a cross-sectional view taken along a line X-X' of FIG. 9.

FIG. 10 is a cross-sectional view taken along the line X-X' of FIG. 9.

Referring to FIG. 10, in the first image sensor 1220 according to some example embodiments of the present inventive concepts, the focusing to a particular target may be improved by shifting the micro lens 220 in units of block regions. Basically, one micro lens 220 may uniformly see all sides on the basis of the original pixel region, and instead only a small number of pixel regions may collect reflected beam for a particular target.

In contrast, in the first image sensor 1220 according to some example embodiments of the present inventive concepts, as the micro lens 220 is shifted in units of block regions, the area of the beam collection region of the block region is partially reduced. Instead, within the beam collection region of the block region, all the micro lenses 220 may simultaneously collect the reflected beam of the same target.

Accordingly, for targets that are blurred and are imaged at low resolution in a conventional image sensor, the first image sensor 1220 according to some example embodiments of the present inventive concepts may image the target with clearer and higher resolution.

Referring to FIGS. 9 and 10, the boundary separation film 130 defining the boundary of each pixel may define the boundary of the block region at the boundary of each block region, such that a boundary separation film 130 at least partially defines adjacent block regions such that the boundary separation film 130 is divided between the adjacent block regions. That is, the first boundary separation film (130, K1) between the fifth pixel region P5 and the sixth pixel region P6 may define a boundary between the first block region B1 and the second block region B2 such that the first boundary separation film (130, K1) at least partially defines the first block region B1 and the second block region B2 such that the first boundary separation film (130, K1) is divided between the first and second block regions B1 and B2. Similarly, the second boundary separation film (130, K2) between the tenth pixel region P10 and the eleventh pixel region P11 may define the boundary between the second block region B2 and the third block region B3 such that the second boundary separation film (130, K2) at least partially defines the second block region B2 and the third block region B3 such that the second boundary separation film (130, K2) is divided between the second and third block regions B2 and B3.

Accordingly, the first boundary separation film (130, K1) may define the boundary between the first block region B1 and the second block region B2, and the second boundary separation film (130, K2) may define the boundary between the second block region B2 and the third block region B3.

The micro lens 220 of the first block region B1 and the micro lens 220 of the second block region B2 may be disposed symmetrically on the basis of the first boundary separation film (130, K1). The micro lens 220 of the second block region B2 and the micro lens 220 of the third block region B3 may be disposed symmetrically on the basis of the second boundary separation film (130, K2). This can be due to the fact that the arrangements of the micro lenses 220 of the first block region B1 through the third block region B3 are identical to each other.

Restated, the plurality of micro lenses 220 located in the first block region B1 and the plurality of micro lenses 220 located in the second block region B2 may collectively include a symmetrical pattern of micro lenses 220 with each other on a basis of the first boundary separation film (130, K1), and the plurality of micro lenses 220 located in the second block region B2 and the plurality of micro lenses 220 located in the third block region B3 may collectively include a symmetrical pattern of micro lenses 220 with each other on a basis of the second boundary separation film (130, K2).

As shown in FIGS. 9-10, each block region (e.g., block region B1) may include micro lenses 220 that are laterally offset from separate, respective pixel region vertical centerlines (e.g., PC1 of the P1 pixel region, PC5 of the P5 pixel region, etc.). As further shown, each block region (e.g., block region B1) may include at least one micro lens 220 that is not laterally offset from (e.g., is aligned with) a pixel region vertical centerline (e.g., PC3 of the P3 pixel region).

Hereinafter, the first image sensor 1220 according to some example embodiments of the present inventive concepts will be described with reference to FIGS. 1, 2, 6, and 11 to 13. The repeated parts of the above-described embodiments will be simplified or omitted.

Figure 11:
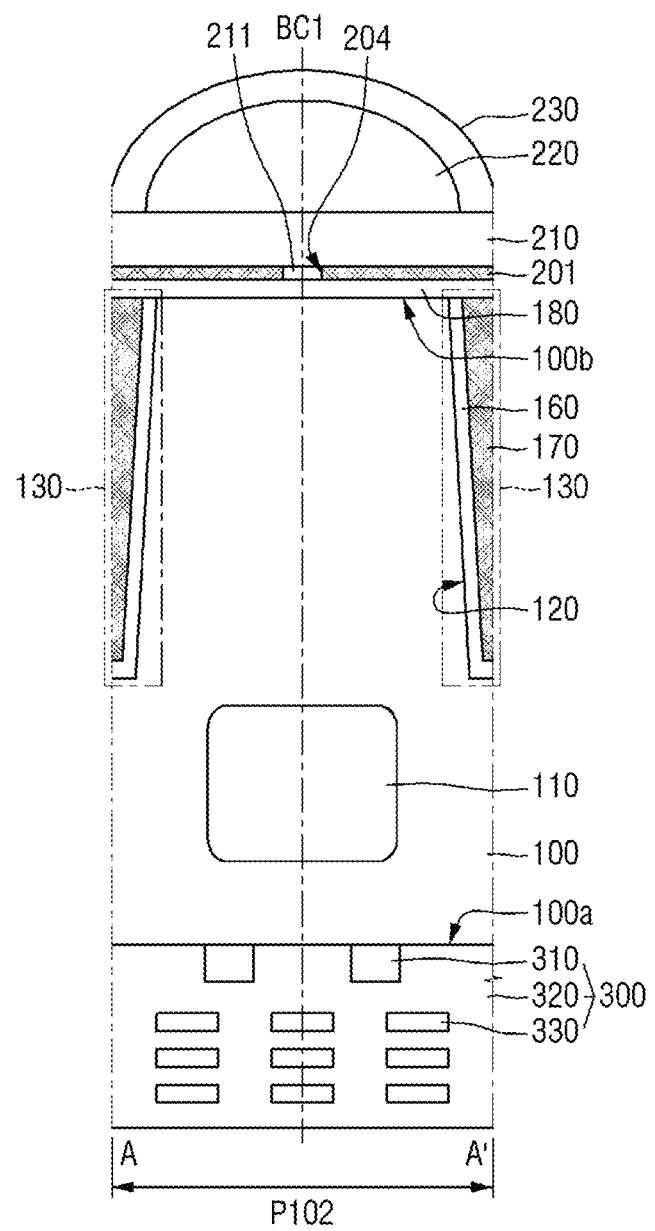
FIG. 11 is a cross-sectional view for explaining the image sensor according to some example embodiments of the present inventive concepts.

FIG. 11 is a cross-sectional view illustrating an image sensor according to some example embodiments of the present inventive concepts.

Referring to FIGS. 1, 2, 6, and 11, the first image sensor 1220 according to some example embodiments of the present inventive concepts may include a metal shield layer 201, an opening 204, and a filling film 211.

The metal shield layer 201 may be formed on the lower planarization film 180. The metal shield layer 201 may cover a part of the lower planarization film 180 and may expose the remaining part. Therefore, the opening 204 may be defined.

The metal shield layer 201 may block the incident beam from going toward the photoelectric element 110 in the substrate 100. That is, the metal shield layer 201 may block other portions except for the opening 204 so that only the vertical component of the incident beam can reach the photoelectric element 110. This is because, in order to clearly recognize small-size targets such as fingerprint ridges and valleys in the object sensing such as fingerprint sensing, it is necessary to block surrounding beam that is not vertical.

The metal shield layer 201 may include a metal. The metal shield layer 201 may include, for example, at least one of tungsten (W), aluminum (Al), and copper (Cu).

The upper planarization film 210 may be formed on the metal shield layer 201. In some example embodiments of the present inventive concepts, a color filter may be additionally formed between the upper planarization film 210 and the metal shield layer 201.

The metal shield layer 201 may be seen like a plurality of structures separated from each other by the opening 204 in the cross section as shown in FIG. 11. However, the metal shield layer 201 may be connected to each other in the planar structure. That is, since the opening 204 may have a circular shape in a planar structure, the opening 204 may be surrounded by the metal shield layer 201.

The opening 204 is defined by the metal shield layer 201 and may be formed to be aligned at the center BC1 of the first block region B1. The opening 204 may be aligned with the photoelectric element 110. That is, the photoelectric element 110 and the opening 204 may be aligned in the vertical direction to match the center BC1 of the first block region B1. Therefore, the vertical component of the incident beam may reach the photoelectric element 110 in the substrate 100 through the opening 204.

The filling film 211 may fill the inside of the opening 204. The filling film 211 is made of a transparent material and allows incident beam to pass therethrough. The filling film 211 may include, for example, at least one of a silicon oxide film-based substance, a silicon nitride film-based substance, a resin, or a combination thereof.

Figure 12:
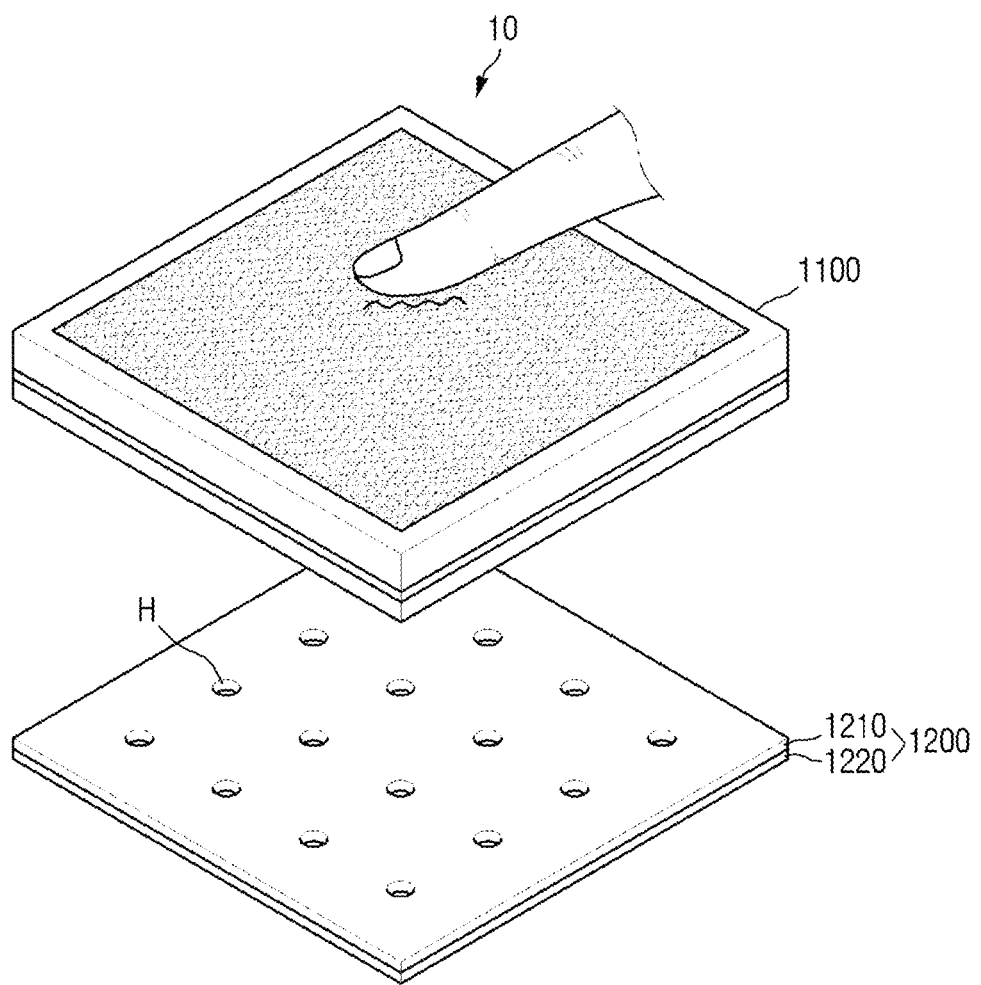
FIG. 12 is a conceptual perspective view for explaining a fingerprint sensing system including the image sensor of FIG. 11.
Figure 13:
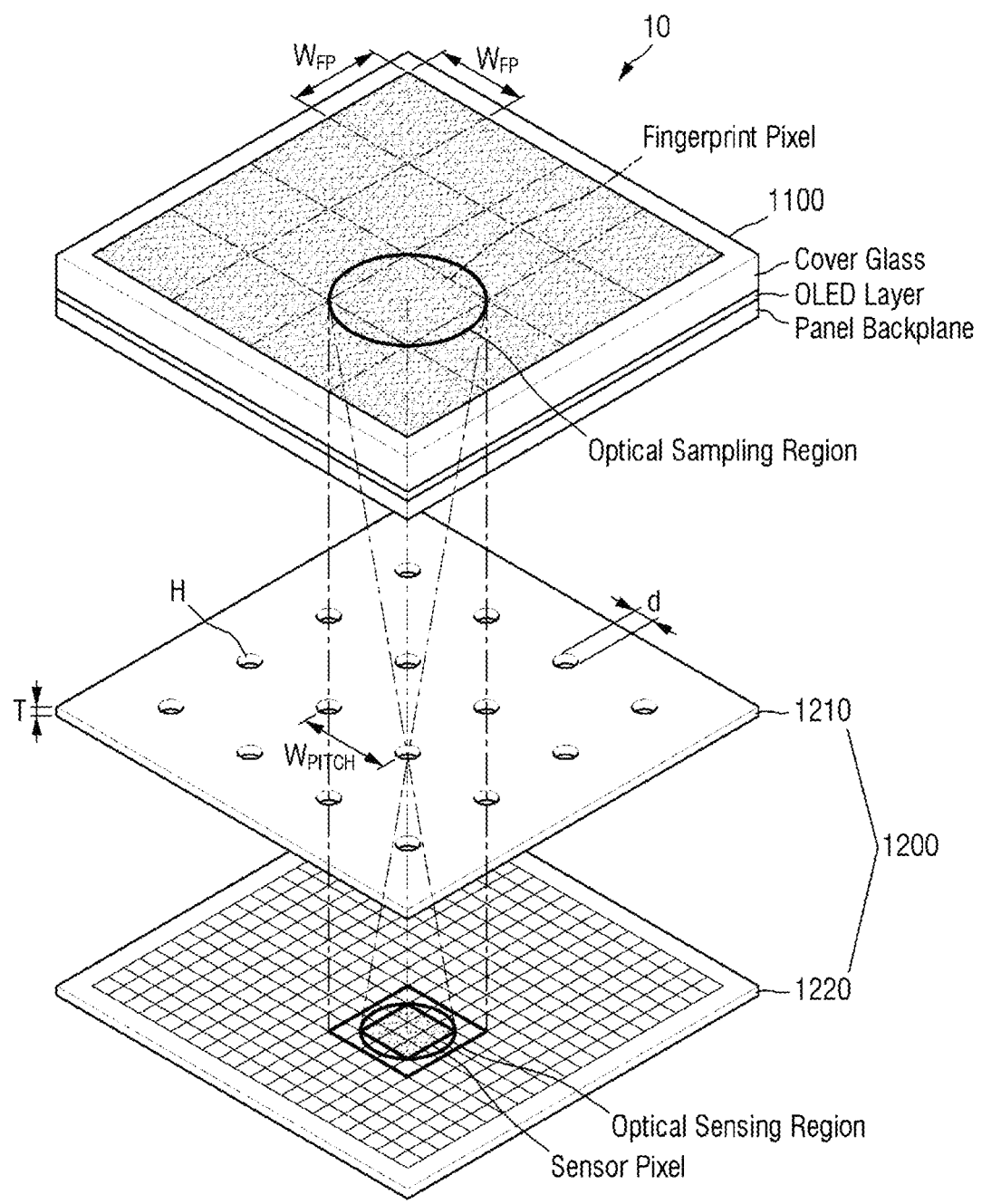
FIG. 13 is an exploded perspective view for explaining the fingerprint sensing system including the image sensor of FIG. 11.

FIG. 12 is a conceptual perspective view for explaining a fingerprint sensing system including the image sensor of FIG. 11, and FIG. 13 is an exploded perspective view for explaining a fingerprint sensing system including the image sensor of FIG. 11.

Referring to FIGS. 12 and 13, the fingerprint sensing system 10 may include a display panel 1100 and a fingerprint sensor 1200. The fingerprint sensor 1200 illustrated in FIG. 12 may be an optical fingerprint sensor that recognizes the fingerprints by sensing beam reflected by the fingerprint ridges and valleys between the ridges via the first image sensor 1220. According to some example embodiments, the fingerprint sensor 1200 may include a pinhole mask 1210 for allowing the beam reflected by the fingerprint to pass, and a first image sensor 1220 which senses the beam passing through the pinhole mask 1210 to generate an electrical signal. According to some example embodiments, the pinhole mask 1210 may be formed of an opaque material so that beam is allowed to pass through the pinhole (H), while blocking beam from passing through a region in which the pinhole (H) is not formed. In some example embodiments, according to some example embodiments, the pinhole mask 1210 may be formed of a material with low reflectivity.

Various kinds of display panels may be applied to the display panel 1100. According to some example embodiments, the display panel 1100 may be an OLED display panel which includes an OLED layer formed with an OLED (organic beam-emitting diode) which emits beam having one or a plurality of colors to perform a display operation. However, some example embodiments of the present inventive concepts does not need to be limited thereto, and the fingerprint sensing system 10 according to some example embodiments of the present inventive concepts may correspond to various types of display panels such as an LCD display panel which performs the display operation, using a general backlight or the OLED. Alternatively, in addition to the above-described OLED display panel and LCD display panel, even when the beam from the beam source of the display panel is reflected by the fingerprint and is transferred in the direction of the back plane of the display panel (or in the direction of the fingerprint sensor 1200), the display panel may also be applied to the display panel 1100 according to some example embodiments of the present inventive concepts.

On the other hand, the fingerprint sensor 1200 may be provided as a semiconductor chip or a semiconductor package and may be attached to one side of the display panel 1100. According to some example embodiments, the first image sensor 1220 may be provided as a semiconductor layer or a semiconductor chip in which a plurality of photoelectric conversion elements (e.g., a photodiode, a phototransistor, a photogate and a pinned photodiode) is formed. According to some example embodiments, the first image sensor 1220 may be a semiconductor layer on which an image sensor such as a CIS (CMOS Image Sensor) or a CCD (Charge Coupled Device) is provided. In the following description, it is assumed that the photoelectric conversion element in the first image sensor 1220 is provided as a photodiode.

According to some example embodiments, in providing the fingerprint sensor 1200, the pinhole mask 1210 may be stacked on the first image sensor 1220 in the course of packaging of the first image sensor 1220. Alternatively, in a process for providing the first image sensor 1220, the pinhole mask 1210 may be stacked on the first image sensor 1220 in the form of a layer in one or more layers constituting the first image sensor 1220. That is, the fingerprint sensor 1200 may be provided in the form in which the pinhole mask 1210 is equipped in the first image sensor 1220, and the packaging process can be performed on the first image sensor 1220 equipped with the pinhole mask 1210. That is, according to some example embodiments, the pinhole mask 1210 and the first image sensor 1220 may be formed integrally.

The pinhole mask 1210 may be provided in various ways, using a material with low beam transmittance and low reflectance. For example, the pinhole mask 1210 may be provided, using a material which has characteristics of low reflectance (or high absorptivity), while blocking beam, and in which its hardness may be maintained for changes in temperature or humidity. As an example, the pinhole mask 1210 may be provided by applying a TiN (titanium nitride) substance onto a silicon material and then forming the pinhole (H). Alternatively, substances such as black nickel and anodized aluminum as different substances other than silicon may be used as materials of the pinhole mask 1210.

According to some example embodiments, the OLED layer and the pinhole mask 1210 provided in the OLED display panel may be disposed substantially in parallel (e.g., in parallel within manufacturing tolerances and/or material tolerances). Thus, the beam from the plurality of OLEDs in the OLED layer can to be transferred in the direction of the fingerprint located on the cover glass, and the beam reflected by the fingerprint can be transferred to the pinhole mask 1210 within an angle of view formed by the pinhole (H) in the pinhole mask 1210. Thus, in the fingerprint sensor according to some example embodiments of the present inventive concepts, it is not necessary to provide another beam guide means for controlling the path through which beam is transferred for sensing the fingerprint.

The fingerprint sensor 1200 sense the fingerprint which is in contact with or located near the display panel 1100. In the fingerprint sensing system 10 according to the embodiments of the present inventive concepts, a fingerprint being in contact with the display of a wearable device such as a smartphone can be recognized, without the necessity of mounting a separate button for fingerprint recognition. For example, when the display panel 1100 corresponds to the OLED display panel and the user's fingerprint is placed on the cover glass of the display panel 1100, beam from the OLED layer in the display panel is used as a beam source and transferred and reflected to the user's fingerprint, and the reflected beam passes through the panel backplane and may be transferred to the first image sensor 1220 through the pinhole mask 1210.

The first image sensor 1220 includes a plurality of pixel regions, and each pixel region senses beam reflected by different regions of the fingerprint and generates an electrical signal corresponding to the sensed beam. Each pixel region (e.g., at least one photoelectric element included therein) may generate an electrical signal corresponding to the beam reflected to the ridge of the fingerprint or may generate an electrical signal corresponding to the beam reflected to the valley between the ridges. The signal may be communicated to a control circuit, including control circuit 2000. The amount of beam detected by the photoelectric elements (e.g., photodiodes) may vary depending on the shape of the fingerprints from which the beam is reflected, and electrical signals having different levels may be generated depending on the amount of sensed beam. That is, the electrical signals from the plurality of pixel regions may include contrast information (or image information), respectively, and it is possible to determine whether the region corresponding to each pixel region is the ridge or the valley, and by combining the determined information, an overall fingerprint image may be constructed.

The regions of the fingerprint optically sampled in the fingerprint sensing system 10 may be defined. As an example, a plurality of fingerprint pixels (WFP) may be defined to correspond to the plurality of pixel regions of the first image sensor 1220, and each fingerprint pixel (WFP) may be correspond to an object region indicated by one pinhole (H) and one pixel region. As various factors, the shape and size of the fingerprint pixel (WFP) corresponding to each pinhole (H) may be determined in accordance with the distance between the display panel 1100 and the pinhole mask 1210, the distance between the pinhole mask 1210 and the first image sensor 1220, the thickness (T) of the pinhole mask 1210, the diameter (d) and the shape of the pinhole (H) or the like.

Each of the fingerprint pixels (WFP) may correspond to one pinhole (H) in the pinhole mask 1210. A region which reflects the beam capable of passing through one pinhole (H) may be included in each fingerprint pixel (WFP), and the region may be defined as an optical sampling region. Depending on the optical sampling region, the optical sensing region corresponding thereto may also be defined in the first image sensor 1220. As an example, the optical sensing region may include a pixel region.

On the other hand, although FIG. 13 illustrates a configuration in which the fingerprint pixel ($W_{FP}$) is located in the entire region of the display panel 1100, some example embodiments of the present inventive concepts does not need to be limited thereto. As an example, the fingerprint pixel ($W_{FP}$) may be located only in a partial region of the display panel 1100. Accordingly, when a user's fingerprint is located in a specific region of the display panel 1100, the fingerprint may be sensed.

In some example embodiments, each of the plurality of pinholes (H) in the pinhole mask 1210 may correspond to each of a plurality of pixel regions in the first image sensor 1220. For example, one pixel region corresponding to one pinhole (H) may include a single photodiode 11. Alternatively, one pixel region corresponding to one pinhole (H)

may include two or more photodiodes 11. FIG. 1 illustrates an example in which one pixel region includes a plurality of photodiodes 11 and the pixel region in the optical sensing region includes a plurality of photodiodes 11. That is, a plurality of pinholes (H) of the pinhole mask 1210 is formed so as to be mapped to the plurality of pixels of the first image sensor 1220, the beam reflected by the fingerprint pixels in the optical sampling region is sensed by one or more photodiodes in the pixel region, and the entire image of the fingerprint may be reconstructed by processing the electrical signals from the plurality of pixel regions.

According to some example embodiments, a region within the first image sensor 1220 may be defined to correspond to each of the fingerprint pixels ($W_{FP}$), and the region corresponding to each of the fingerprint pixels ($W_{FP}$) may include a plurality of photodiodes. In some example embodiments, the pixel region may correspond to a region including at least a part of the plurality of photodiodes corresponding to the fingerprint pixel ($W_{FP}$). That is, one pixel region needs to sense beam corresponding to the fingerprint pixel ($W_{FP}$) corresponding thereto, and it is necessary to prevent overlap of the beam corresponding to another fingerprint pixel ($W_{FP}$). In the example of FIG. 1, an example is illustrated in which the region corresponding to each fingerprint pixel ($W_{FP}$) includes 5*5 photodiodes and the pixel region includes 3*3 photodiodes as a part thereof. A fingerprint image (or a partial fingerprint image) may be constructed on the basis of the electrical signals from 3*3 photodiodes in the region corresponding to each fingerprint pixel ($W_{FP}$).

On the other hand, in some example embodiments, the fingerprint sensing system 10 has been described to sense the fingerprint of the user, but some example embodiments of the present inventive concepts do not need to be limited thereto. For example, when a particular (or, alternatively, predetermined) object is positioned on the display panel 1100, the fingerprint sensor 1200 senses the beam reflected by the particular (or, alternatively, predetermined) object and may generate the sensing result. When each fingerprint pixel of the fingerprint sensor 1200 generates image data as a sensing result, the image of the object located on the display panel 1100 may be reconstructed, using the image data from each fingerprint pixel of the fingerprint sensor 1200.

In the first image sensor 1220 according to some example embodiments, no additional optical lens is required on the micro lens in order to sense the fingerprint. Therefore, it may be important to sense the positions of the ridge and the valley of the fingerprint with clear and high resolution, without considering a chief ray angle (CRA) of the optical lens.

As a result, the shift of the micro lens 220 of the first image sensor 1220 is executed in units of block regions, and the positions of ridges and valleys disposed in the fingerprint can be more clearly imaged.

Hereinafter, a second image sensor 1221 according to some example embodiments of the present inventive concepts will be described with reference to FIGS. 1 and 14 to 16. The repeated parts of the above-described embodiments will be simplified or omitted.

Figure 14:
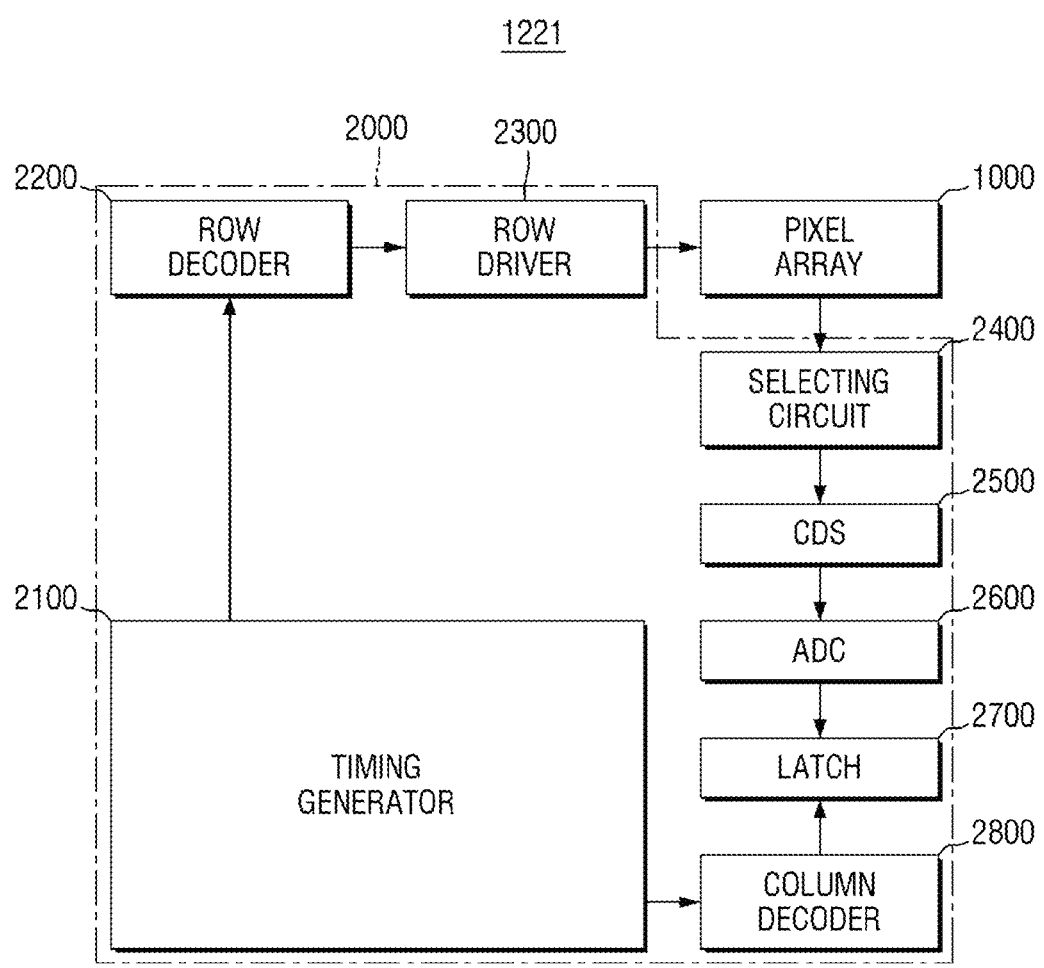
FIG. 14 is a block diagram for explaining the image sensor according to some example embodiments of the present inventive concepts.
Figure 15:
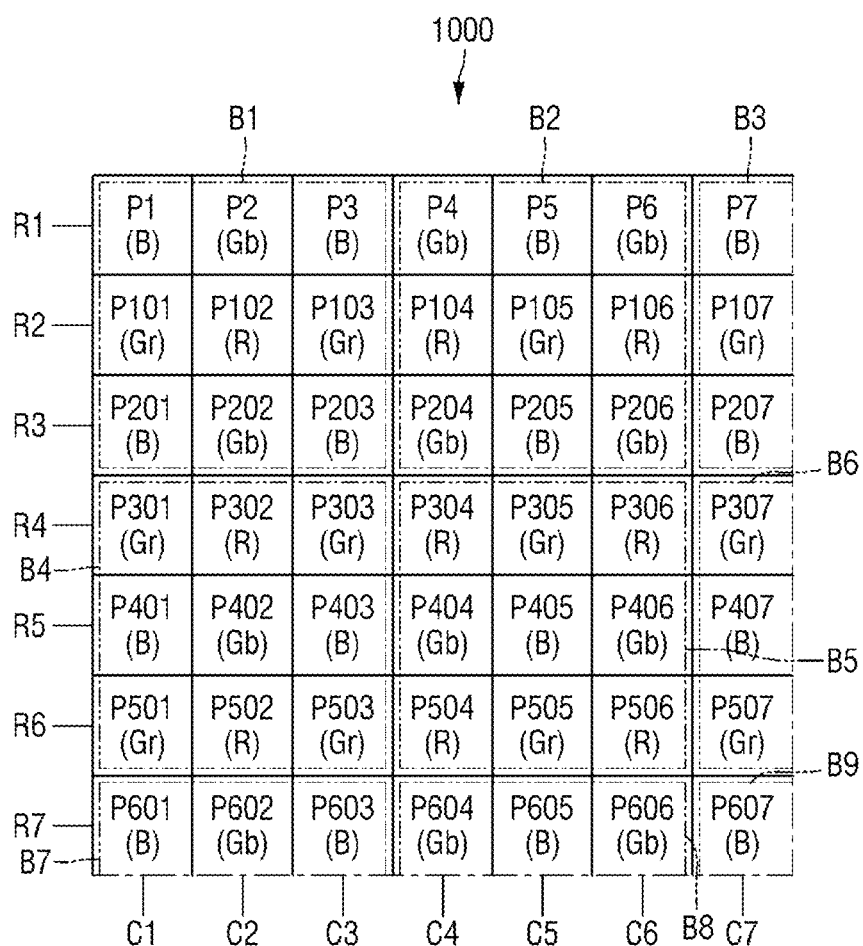
FIG. 15 is a conceptual diagram for explaining the image sensor according to some example embodiments of the present inventive concepts.

FIG. 14 is a block diagram for explaining an image sensor according to some example embodiments of the present inventive concepts, and FIG. 15 is a conceptual diagram for explaining an image sensor according to some example embodiments of the present inventive concepts. FIG. 16 is a conceptual diagram for explaining a binning mode of the image sensor according to some example embodiments of the present inventive concepts.

Referring to FIGS. 1 and 14, a control circuit 2000 of a second image sensor 1221 according to some example embodiments of the present inventive concepts may selectively execute a full mode and a binning mode (e.g., may selectively execute the full mode or the binning mode). The control circuit 2000 of the second image sensor 1221 may further include a selection circuit 2400.

Referring to FIGS. 14 and 15, a row driver 2300 and a selection circuit 2400 of the control circuit 2000 may execute imaging, using information of all the pixel regions of the pixel array 1000 in the full mode.

The pixel array 1000 may include an RGB pixel region of a bayer pattern. That is, the blue pixel (B), the red pixel (R), and the green pixel (Gb, Gr) may be disposed within the pixel array 1000 in the bayer pattern. Restated, the pixel array 1000 may include block regions that include separate color regions (e.g., first to third color regions) which are configured to receive beams of different colors. For example, the blue pixel (B) may be a blue color region that is configured to receive beams of a blue color, the red pixel (R) may be a red color region that is configured to receive beams of a red color, and the green pixel (Gb, Gr) may be a green color region that is configured to receive beams of a green color.

The blue pixel (B) is a pixel region that filters the remaining part except for the blue color component of the incident beam, using a blue color filter as the color filer, and the red pixel (R) is a pixel region that filters the remaining part except for the red color component of the incident beam, using a red color filter as the color filter. The green pixel (Gb, Gr) is a pixel region which filters the remaining part except for the green color component of incident beam, using a green color filter as the color filter.

All the pixel regions adjacent to the blue pixel (B) of the pixel array 1000 according to the bayer pattern are the green pixels (Gb, Gr), and all the pixel regions adjacent to the red pixel (R) may be green pixels (Gb, Gr). Further, the blue pixel (B) and the red pixel (R) may be adjacent to each other in an oblique direction.

The control circuit 2000, in selectively executing the full mode, may utilize the information (e.g., electrical signals) of all the pixel regions of the pixel array 1000 in the full mode. That is, the row driver 2300 may apply a signal to all the row signal lines (R1 to R7). Further, the selection circuit 2400 may receive the outputs of all the columns via the column signal lines (C1 to C7).

After receiving the output of the pixel array 1000, the selection circuit 2400 may transmit the output to the correlated double sampler 2500.

Referring to FIGS. 14 and 16, the row driver 2300 and the selection circuit 2400 of the control circuit 2000 may execute the imaging, using only information of a partial pixel region of the pixel array 1000 in the binning mode. Restated, the control circuit 2000, in selectively executing the binning mode, may utilize a limited portion of the information (e.g., electrical signals) of the pixel regions (e.g., the information of a limited portion of the pixel regions) of the pixel array 1000.

For example, only the outputs of P1, P3, P201 and P203 pixel regions are used in the first block region B1, and the entire first block region B1 may be used as the blue pixel (B). Similarly, only the outputs of the P4, P6, P204 and P206 pixel regions are used in the second block region B2, and the entire second block region B2 may be used as the green pixel (Gb). In the fifth block region (B5), only the outputs of the pixel regions P304, P306, P504, and P506 are used, and the entire fifth block region B5 may be used as the red pixel (R).

For example, the control circuit 2000 may selectively execute the binning mode such that each block region of the pixel array 1000 utilizes only one color region (e.g., only one or more blue pixels (B) included therein) of multiple color regions included therein.

The binning mode may reduce the amount of transfer data to dramatically improve the operation speed of the image sensor. However, the resolution may be relatively lowered during the binning mode. In order to prevent this, the second image sensor 1221 of some example embodiments may perform the shift of the micro lens 220 in the same unit as the block region unit in which the binning mode is executed.

Through this, the second image sensor 1221 according to some example embodiments is capable of performing the imaging without lowering the resolution, while having the advantage of high-speed transfer of the binning mode.

In concluding the detailed description, those skilled in the art will appreciate that many variations and modifications can be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. An image sensor, comprising:
    a substrate which includes a plurality of block regions, each of the block regions including a first to fifth pixel regions, the second and third pixel regions arranged in a first direction with the first pixel region interposed therebetween, and the fourth and fifth pixel regions arranged in a second direction with the first pixel region interposed therebetween, and the second direction intersecting the first direction;
    first to fifth photoelectric elements in separate, respective pixel regions of the first to fifth pixel regions; and
    first to fifth micro lenses on separate, respective pixel regions of the first to fifth pixel regions,
    wherein the first micro lens has a same vertical centerline as a vertical centerline of the first pixel region,
    the second micro lens is laterally offset from a vertical centerline of the second pixel region by a first interval,
    the third micro lens is laterally offset from a vertical centerline of the third pixel region by the first interval,
    the fourth micro lens is laterally offset from a vertical centerline of the fourth pixel region by a second interval, and
    the fifth micro lens is laterally offset from a vertical centerline of the fifth pixel region by the second interval.

2. The image sensor of claim 1, wherein each of the block regions includes a common pattern of the first to fifth micro lenses, such that each of the block regions includes a common shifted shape of the first to fifth micro lenses.

3. The image sensor of claim 1, wherein a center of the first pixel region is the same with a center of each of the block regions.

4. The image sensor of claim 1, wherein distances between the vertical centerline of the first pixel region and the vertical centerline of each of the second to fourth pixel regions are the same each other.

5. The image sensor of claim 1, wherein the first interval and the second interval are the same each other.

6. The image sensor of claim 1, wherein the second to fifth micro lenses are laterally offset towards the vertical centerline of the first pixel region.

7. The image sensor of claim 1, wherein each of the block regions further includes a sixth pixel region spaced apart from the first pixel region in the first direction with the second pixel region interposed therebetween,
    wherein the sixth pixel region includes a sixth photoelectric elements and a sixth micro lens, and
    the sixth micro lens is laterally offset from a vertical centerline of the sixth pixel region by a third interval greater than the first interval.

8. The image sensor of claim 1, further comprising:
    a boundary separation trench in the substrate, the first pixel region being defined to be separated from the second to fourth pixel regions by the boundary separation trench; and
    a reflection prevention film at least partially filling the boundary separation trench.

9. The image sensor of claim 8, further comprising:
    a lower planarization film on the reflection prevention film and the substrate; and
    a side surface reflection prevention film on the lower planarization film and covering a part of the lower planarization film, the side surface reflection prevention film overlapping the boundary separation trench in a vertical direction.

10. The image sensor of claim 1, further comprising a metal shield layer including an opening exposing a part of the substrate, between the substrate and the first micro lens,
    wherein the opening of the metal shield layer has a circular shape in a plan view.

11. The image sensor of claim 1, further comprising a control circuit configured to receive electrical signals generated by the first to fifth photoelectric elements.

12. The image sensor of claim 11, wherein the electrical signals include image data of fingerprints.

13. An image sensor, comprising:
    a substrate which includes a plurality of block regions, each of the block regions including
        a center pixel region and a plurality of first peripheral pixel regions disposed around the center pixel region;
        a first photoelectric element in the center pixel region;
        a first micro lens on the center pixel region;
        a second photoelectric element in each of the first peripheral pixel regions; and
        a second micro lens on each of the first peripheral pixel regions,
    wherein a center of the second micro lens is shifted from a vertical centerline of each of the first peripheral pixel regions towards a center of the first micro lens,
    wherein the plurality of block regions include separate, respective sets of pixel regions, and the first and second micro lenses of the plurality of block regions are shifted in units of block regions, such that each separate block region includes a different center pixel region, a different plurality of first peripheral pixel regions, and different second micro lenses shifted towards a different first micro lens.

14. The image sensor of claim 13, wherein each of the block regions includes a common pattern of the first and second micro lenses, such that each of the block regions includes a common shifted shape of the first and second micro lenses.

15. The image sensor of claim 13, wherein each of the block regions has a square shape, and
    the center pixel region and the first peripheral pixel regions are arranged in a form of (N×N) matrix (here, N is a natural number more than 3).

16. The image sensor of claim 13, wherein each of the block regions has a rectangle shape, and
the center pixel region and the first peripheral pixel regions are arranged in a form of (N×M) matrix (here, N and M are natural numbers more than 3, and M is different from N).

17. The image sensor of claim 13, wherein each of the block regions further includes a plurality of second peripheral pixel regions disposed around the first peripheral pixel regions,
each of the second peripheral pixel regions includes a third photoelectric element and a third micro lens, and
a center of the third micro lens is shifted from a vertical centerline of each of the second peripheral pixel regions towards the center of the first micro lens.

18. The image sensor of claim 17, wherein the center of the second micro lens is shifted from the vertical centerline of each of the first peripheral pixel regions by a first interval, and
the center of the third micro lens is shifted from the vertical centerline of each of the second peripheral pixel regions by a second interval greater than the first interval.

19. The image sensor of claim 13, wherein the image sensor is a fingerprint sensor that recognizes fingerprints by sensing beam reflected by fingerprint ridges and fingerprint valleys between the fingerprint ridges.

* * * * *